(12) United States Patent
Swager et al.

(10) Patent No.: US 9,755,150 B2
(45) Date of Patent: Sep. 5, 2017

(54) FUNCTIONALIZED NANOSTRUCTURES AND RELATED DEVICES

(71) Applicant: Massachusetts Institute of Technology, Cambridge, MA (US)

(72) Inventors: Timothy M. Swager, Newton, MA (US); Vladimir Bulovic, Lexington, MA (US); Ggoch Ddeul Han, Cambridge, MA (US); Trisha L. Andrew, Madison, WI (US)

(73) Assignee: Massachussets Institute of Technology, Cambridge, MA (US)

( * ) Notice: Subject to any disclaimer, the term of this patent is extended or adjusted under 35 U.S.C. 154(b) by 784 days.

(21) Appl. No.: 13/785,476

(22) Filed: Mar. 5, 2013

(65) Prior Publication Data
US 2014/0102539 A1    Apr. 17, 2014

Related U.S. Application Data

(60) Provisional application No. 61/715,026, filed on Oct. 17, 2012.

(51) Int. Cl.
| | | |
|---|---|---|
| *B32B 9/00* | (2006.01) | |
| *H01L 51/00* | (2006.01) | |
| *B82Y 30/00* | (2011.01) | |
| *C01B 31/02* | (2006.01) | |
| *C01B 31/04* | (2006.01) | |

(Continued)

(52) U.S. Cl.
CPC .......... *H01L 51/0047* (2013.01); *B82Y 10/00* (2013.01); *B82Y 30/00* (2013.01); *C01B 31/022* (2013.01); *C01B 31/0438* (2013.01); *H01L 51/0003* (2013.01); *H01L 51/4253* (2013.01); *Y02E 10/549* (2013.01); *Y10S 977/738* (2013.01); *Y10S 977/746* (2013.01); *Y10S 977/948* (2013.01)

(58) Field of Classification Search
CPC .......... C01B 31/022–31/0293; C01B 31/0438; Y10T 428/30; Y10S 977/742
USPC .......................................... 428/408; 423/448
See application file for complete search history.

(56) References Cited

U.S. PATENT DOCUMENTS

| | | |
|---|---|---|
| 2006/0275371 A1 | 12/2006 | Dai et al. |
| 2008/0221240 A1* | 9/2008 | Swager .................. B82Y 30/00 524/99 |

(Continued)

FOREIGN PATENT DOCUMENTS

CN    101720305 A    6/2010

OTHER PUBLICATIONS

International Search Report and Written Opinion for Application No. PCT/US2013/029079 mailed May 6, 2013.

(Continued)

*Primary Examiner* — Daniel H Miller
(74) *Attorney, Agent, or Firm* — Wolf, Greenfield & Sacks, P.C.

(57) ABSTRACT

Embodiments described herein provide functionalized carbon nanostructures for use in various devices, including photovoltaic devices (e.g., solar cells). In some embodiments, carbon nanostructures substituted with at least one cyclobutyl and/or cyclobutenyl group are provided. Devices including such materials may exhibit increased efficiency, increased open circuit potential, high electron/hole mobility, and/or low electrical resistance.

22 Claims, 11 Drawing Sheets

(51) Int. Cl.
*B82Y 10/00* (2011.01)
*H01L 51/42* (2006.01)

(56) References Cited

U.S. PATENT DOCUMENTS

2009/0306427 A1 12/2009 Martinez-Rubi et al.
2012/0171093 A1 7/2012 Swager et al.

OTHER PUBLICATIONS

Han et al., Cyclobutadiene-C 60 Adducts: N-Type Materials for Organic Photovoltaic Cells with High V OC. Advanced Functional Materials. Jan. 16, 2013;23(24):6031-9. Supporting Information included. 25 pages.
International Preliminary Report on Patentability for International Application No. PCT/US2013/029079, mailed Apr. 30, 2015.
Driessen et al., Aluminum trichloride .sigma. complexes of cyclobutadienes. J Am Chem Soc. Feb. 15, 1978; 100(4): 1193-1200.
Extended European Search Report for Application No. 13847153.7 mailed May 17, 2016.

* cited by examiner

FUNCTIONALIZED NANOSTRUCTURES AND RELATED DEVICES

RELATED APPLICATIONS

This application claims priority under 35 U.S.C. §119(e) to U.S. Provisional Application Ser. No. 61/715,026, filed Oct. 17, 2012, the contents of which are incorporated herein by reference in its entirety for all purposes.

FIELD OF THE INVENTION

Compositions and devices including nanostructures comprising cyclobutyl-containing species and/or cyclobutenyl-containing species are provided, as well as related methods.

BACKGROUND OF THE INVENTION

Bulk heterojunction (BHJ) polymer solar cells (PSCs) composed of conjugated polymer donors and small or macromolecule acceptors have been of interest in the development of organic photovoltaic cells. The bicontinuous nature of the phases in BHJ creates a large surface to volume ratio for efficient exciton dissociation, and the facile and low-cost fabrication is also appealing. Despite extensive efforts to improve the properties of the constituent materials and morphologies of BHJ systems, the lower power conversion efficiency (PCE) as compared to silicon-based solar cells remains a challenge. Researchers have developed low band gap polymers that absorb a high fraction of the solar spectrum and assemble into desirable film morphologies. Efforts to improve n-type acceptor components have included BHJs with small molecules such as 9,9'-bifluorenylidenes, perylenediimides, and vinazenes. Nevertheless, fullerenes are widely used in part due to their high electron affinities and low reorganization energies in the electron transfer reactions. Reactions with organometallic reagents, radicals, and transition-metal complexation have been investigated to create new fullerenes for BHJs. The reactivity of fullerene resembles that of an electron-deficient polyolefin, and as such, a dominant functionalization approach has been to use cycloaddition reactions to modify the fullerene structure. Noteworthy examples include the synthesis of PCBM ([6,6]-phenyl-$C_{61}$-butyric acid methyl ester) via 1,3-dipolar cycloaddition and the indene-$C_{60}$ adducts from Diels-Alder reactions. However, reacting fullerenes often requires an excess of reagents, long reaction times, and high temperatures.

Less-than-optimal band offsets at the BHJs can lead to energy loss and low open-circuit voltages in solar cells. In order to address this issue and increase power conversion efficiencies, there have been efforts to increase the $HOMO_D$-$LUMO_A$ (A: acceptor, D: donor) gap which is proportional to the open-circuit voltage. Many polymer donors have been designed for optimized absorption of the solar spectrum by having a repeating structure with alternating electron-rich and electron-poor units. However, lowering the HOMO levels in these systems is often complicated by the fact that simple modifications of the electron-rich repeating units can lead to an expanded band gap that reduces the solar absorption efficiency, thereby giving a smaller short-circuit current density ($J_{SC}$). Another approach is to raise the LUMO level of the fullerenes, a strategy which offers a more predictive route to increased $V_{OC}$s. Most functionalization methods, including cycloaddition reactions, break the full conjugation of the $C_{60}$ π-system and generally decrease the electron affinity and raise the LUMO level. The decreased relative electron affinity of $C_{60}$ is measured by the change of the onset reduction potential or the calculated LUMO level. For example, indene-$C_{60}$ has been shown to exhibit ca. 100-200 mV reduced electron affinities (higher LUMO) relative to $C_{60}$.

SUMMARY OF THE INVENTION

Various compositions, devices, and methods are provided. In some embodiments, devices are provided comprising a composition comprising a carbon nanostructure comprising at least one cyclobutyl and/or at least one cyclobutenyl group, any of which is optionally substituted; and at least one electrode in electrochemical communication with the composition. In some embodiments, the device is a battery. In some embodiments, the device is a capacitor. In some embodiments, the device is a transistor. In some embodiments, the device is a catalyst system. In some embodiments, the device is a solar cell. In some embodiments, the device is a chemical or biological sensor.

In some embodiments, photovoltaic devices are provided comprising an electron donor material; and an electron acceptor material comprising a cyclobutyl-containing group and/or a cyclobutenyl-containing group in contact with the electron donor material. In some cases, the electron acceptor material comprises a carbon nanostructure comprising the cyclobutyl-containing group and/or a cyclobutenyl-containing group. In some embodiments, the electron donor material comprises a conducting polymer. In some embodiments, the conducting polymer is a poly(thiophene). In some embodiments, the electron acceptor and the electron donor material contact one another to form a bulk heterojunction.

In some embodiments, the photovoltaic device exhibits a higher open circuit potential relative to an essentially identical photovoltaic device lacking the cyclobutyl-containing species and/or cyclobutenyl-containing species, under essentially identical conditions. In some embodiments, the photovoltaic device exhibits a higher efficiency relative to an essentially identical photovoltaic device lacking the cyclobutyl-containing species and/or cyclobutenyl-containing species, under essentially identical conditions. In some embodiments, the photovoltaic device is a solar cell.

In some embodiments, methods for fabricating a device are provided, comprising reacting a carbon nanostructure with a cyclobutenyl group precursor to produce a functionalized carbon nanostructure comprising an optionally substituted cyclobutenyl group; and arranging the functionalized carbon nanostructure in electrochemical communication with an electrode. In some embodiments, the reacting comprises exposure to a Lewis acid. In some embodiments, the Lewis acid is $AlCl_3$.

In some embodiments, the cyclobutenyl group precursor comprises an alkyne species. In some embodiments, the alkyne species has the structure,

wherein $R^a$ and $R^b$ can be the same or different and are hydrogen, alkyl, or heteroaryl, any of which is optionally substituted. In some embodiments, at least one of $R^a$ and $R^b$ is not hydrogen. In some embodiments, $R^a$ and $R^b$ are both alkyl.

In some embodiments, the method further comprises reacting the functionalized carbon nanostructure under conditions which result in the conversion of the cyclobutenyl group to a cyclobutyl group, optionally substituted. In some embodiments, the functionalized carbon nanostructure is exposed to a peroxide-containing reagent, resulting in epoxidation of the cyclobutenyl group.

In some embodiments, the method further comprises reacting the functionalized carbon nanostructure under conditions which result in the occurrence of a cycloreversion reaction of the functionalized carbon nanostructure, such that an alkene species is generated, wherein the alkene species is not bonded to the carbon nanostructure.

In some embodiments, the method further comprises reacting the functionalized carbon nanostructure under conditions which result in at least one atom or chemical group of the functionalized carbon nanostructure being replaced with a second, different atom or chemical group, or under conditions which result in at least one atom or chemical group of the functionalized carbon nano structure being linked to a second, different atom or chemical group. In some embodiments, the reacting comprises heating. In some embodiments, the reacting comprises exposure to acid or base. In some embodiments, the reacting comprises photochemically reacting.

In some embodiments, the method comprises arranging the functionalized carbon nanostructure within a battery. In some embodiments, the method comprises arranging the functionalized carbon nanostructure within a capacitor. In some embodiments, the method comprises arranging the functionalized carbon nanostructure within a transistor. In some embodiments, the method comprises arranging the functionalized carbon nanostructure within a catalyst system. In some embodiments, the method comprises arranging the functionalized carbon nanostructure within a solar cell. In some embodiments, the method comprises arranging the functionalized carbon nanostructure within a chemical or biological sensor.

In any of the foregoing embodiments, the carbon nanostructure may comprise a fused network of aromatic rings, optionally comprising a border at which the fused network terminates, wherein the at least one cyclobutyl and/or at least one cyclobutenyl group is attached to the network via at least one ring atom of the network. In some embodiments, a ring atom of the at least one cyclobutyl and/or at least one cyclobutenyl group forms a covalent bond with a ring atom of the network of aromatic rings. In some embodiments, two ring atoms of the at least one cyclobutyl and/or at least one cyclobutenyl group form covalent bonds with two ring atoms of the network of aromatic rings. In some embodiments, the carbon nanostructure comprises two cyclobutenyl groups, optionally substituted. In some embodiments, the carbon nanostructure comprises three cyclobutenyl groups, optionally substituted.

In any of the foregoing embodiments, the carbon nanostructure may be a fullerene, a nanotube, graphene, or graphite. In some embodiments, the carbon nanostructure is a single-walled or multi-walled nanotube. In some embodiments, the carbon nanostructure is a fullerene.

In any of the foregoing embodiments, the at least one cyclobutyl and/or at least one cyclobutenyl group may be substituted with an electron-donating group. In any of the foregoing embodiments, the at least one cyclobutyl and/or at least one cyclobutenyl group may not be substituted with an electron-withdrawing group.

In any of the foregoing embodiments, the carbon nanostructure may comprise a cyclobutenyl group. In some embodiments, the carbon nanostructure comprises a cyclobutenyl group having the following structure,

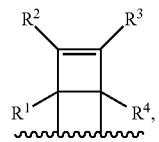

wherein:

" ⌇⌇⌇⌇ " comprises the fused network of aromatic rings of the carbon nanostructure; and $R^1$-$R^4$ can be the same or different and are hydrogen, hydroxyl, halo, alkyl, heteroalkyl, alkenyl, heteroalkenyl, aryl, heteroaryl, or heterocycle, any of which is optionally substituted.

In some embodiments, the carbon nanostructure comprises the following structure,

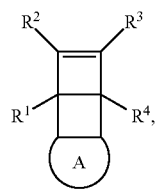

wherein:

A is a carbon nanostructure; and $R^1$-$R^4$ can be the same or different and hydrogen, hydroxyl, halo, alkyl, heteroalkyl, alkenyl, heteroalkenyl, aryl, heteroaryl, or heterocycle, any of which is optionally substituted.

In some embodiments, $R^1$-$R^4$ are alkyl. In some embodiments, $R^1$-$R^4$ are methyl, ethyl, propyl, butyl, pentyl, or hexyl. In some embodiments, $R^1$-$R^4$ are methyl. In some embodiments, $R^1$-$R^4$ are butyl.

In any of the foregoing embodiments, the carbon nanostructure may comprise a cyclobutyl group. In some embodiments, the carbon nanostructure comprises a cyclobutyl group having the following structure,

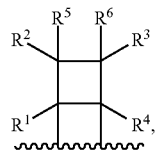

wherein:

" ⌇⌇⌇⌇ " comprises the fused network of aromatic rings of the carbon nanostructure; and $R^1$-$R^6$ can be the same or different and are hydrogen, hydroxyl, halo, alkyl, heteroalkyl, alkenyl, heteroalkenyl, aryl, heteroaryl, or heterocycle, any of which is optionally substituted, or any two of $R^1$-$R^6$ are joined to form an optionally substituted ring.

In some embodiments, the carbon nanostructure comprises the following structure,

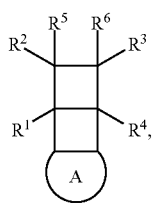

wherein:

A is a carbon nanostructure; and $R^1$-$R^6$ can be the same or different and are hydrogen, hydroxyl, halo, alkyl, heteroalkyl, alkenyl, heteroalkenyl, aryl, heteroaryl, or heterocycle, any of which is optionally substituted, or any two of $R^1$-$R^6$ are joined to form an optionally substituted ring.

In some embodiments, $R^5$ and $R^6$ are joined to form an optionally substituted ring. In some embodiments, $R^5$ and $R^6$ are joined to form an epoxide ring. In some embodiments, at least one of $R^1$-$R^4$ is not hydrogen. In some embodiments, at least one of $R^1$-$R^6$ is not hydrogen.

Figure 1A:
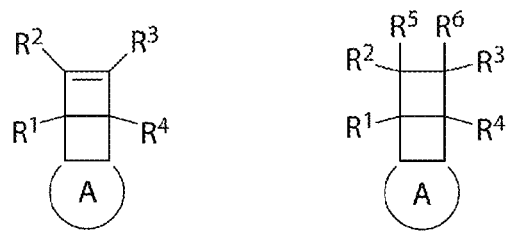
FIG. 1 shows (a) the structure of cyclobutene-substituted carbon nanostructures and (b) structures of some substituted fullerenes.
Figure 1B:
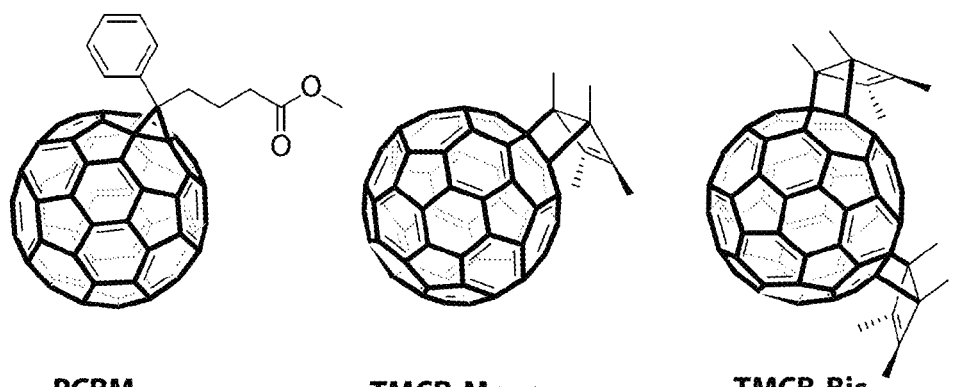
Figure 1B:
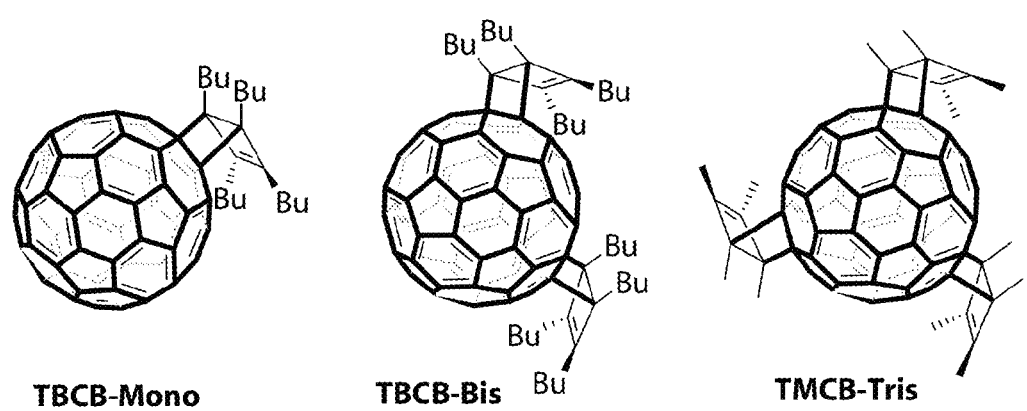

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Embodiments described herein provide functionalized carbon nanostructures for use in various devices, including photovoltaic devices (e.g., solar cells). Devices including such materials may exhibit increased efficiency, increased open circuit potential, high electron/hole mobility, and/or low electrical resistance.

In some cases, carbon nanostructures having one or more functional groups capable of enhancing the electronic properties of the carbon nanostructures are provided. The composition may include functional groups which are selected and positioned to interact with a portion of the carbon nanostructure, thereby enhancing one or more properties of the carbon nanostructure. For example, the carbon nanostructure may include a functional group positioned in close physical proximity to the pi-system of the carbon nanostructure, resulting in favorable cofacial pi-orbital interactions which affect the electronic properties of the carbon nanostructure. In some cases, the functional group may affect (e.g., increase, decrease) the electron affinity of the carbon nano structure. In some cases, the functional group may affect (e.g., increase, decrease) the energy level of the lowest unoccupied molecular orbital (LUMO) of the carbon nanostructure. As an illustrative embodiment, the carbon nanostructure may be a fullerene (e.g., $C_{60}$) which includes an olefin functional group attached to and positioned in close proximity to the surface of the fullerene, allowing for cofacial pi-orbital interactions between the olefin and the fullerene. Such interactions may effectively increase the LUMO level of the fullerene and enhance the electron-accepting ability of the fullerene.

Some embodiments may provide methods for synthesizing a functionalized or substituted carbon nanostructure. As used herein, the terms "substituted" and "functionalized" are given their ordinary meaning in the art and refer to species which have been altered (e.g., reacted) such that a new functional group (e.g., atom or chemical group) is bonded to the species. In some cases, the functional group may form a bond to one atom (e.g., a ring atom) of the carbon nanostructure. In some cases, the functional group may be fused to the carbon nanostructure via two atoms (e.g., two ring atoms) of the carbon nanostructure.

The carbon nanostructure may include one or more functional groups which may be further reacted to attach additional groups to the carbon nanostructure and/or functional group. That is, the functional group may serve as a precursor for a wide range of additional functional groups that may be bonded to the carbon nanostructure. This may allow for the facile tailoring of various properties of carbon nanostructures, including stability, solubility, miscibility, biocompatibility, optical properties, electronic properties, binding properties, surface affinities, and the like. In one set of embodiments, a carbon nanostructure may be functionalized with various alkyl groups, which may increase the solubility of the carbon nanostructure in organic solvents such as chloroform, dichloromethane, and toluene. In some embodiments, the functionalization of carbon nanostructures may be readily reversible, which can be useful in applications such as exfoliation or deaggregation of carbon nanostructures.

In some embodiments, compositions comprising carbon nanostructures substituted with at least one optionally substituted cyclobutyl and/or at least one optionally substituted cyclobutenyl group are provided. In some cases, the carbon nanostructure includes one or more cyclobutyl groups. In some cases, the carbon nanostructure includes one or more cyclobutenyl groups. In some cases, the carbon nanostructure includes a combination of cyclobutyl and cyclobutenyl groups. For example, the carbon nanostructure may include a fused network of aromatic rings, optionally comprising a border at which the fused network terminates, such that the cyclobutyl and/or cyclobutenyl group is attached to the network via at least one ring atom of the network. In some cases, the cyclobutyl and/or cyclobutenyl group is attached to the network via two ring atoms of the network (e.g., two adjacent ring atoms of the network). In some embodiments, the cyclobutyl and/or cyclobutenyl group may be directly bonded to the carbon nanostructure, i.e., a ring atom of the cyclobutyl and/or cyclobutenyl group may form a covalent bond with a ring atom of the network of aromatic rings. In some cases, two ring atoms of the at least one cyclobutyl and/or at least one cyclobutenyl group form covalent bonds with two ring atoms of the network of aromatic rings. By contrast, a cyclobutyl and/or cyclobutenyl group is not directly bonded to the carbon nanostructure if there is another atom or group (e.g., a methylene group, an aryl group, a metal atom, etc.) present that links the cyclobutyl and/or cyclobutenyl group to the carbon nanostructure.

The cyclobutyl and/or cyclobutenyl group may be selected such that a portion of the cyclobutyl and/or cyclobutenyl group is arranged in a substantially fixed position relative to the carbon nanostructure. That is, a portion of the cyclobutyl and/or cyclobutenyl group may not freely rotate such that the portion can be positioned at a range of different distances from the carbon nanostructure. In some cases, a portion of the cyclobutyl and/or cyclobutenyl group may be positioned in a substantially fixed position about 3 Angstroms (e.g., 3.1 Angstroms) from the carbon nanostructure. For example, a fullerene may be fused to a tetraalkylcyclobutene group via two bonds, such that a portion of the tetraalkylcyclobutene group is arranged in a substantially fixed position above the fullerene. In some cases, the portion includes a carbon-carbon double bond, which is positioned in sufficient proximity to the carbon nanostructure to interact with the carbon nanostructure via cofacial pi-interactions. In some cases, the four ring atoms of the cyclobutyl and/or cyclobutenyl group may be positioned in a substantially fixed position relative to the carbon nanostructure, but one or more substituents of the cyclobutyl and/or cyclobutenyl group may freely rotate.

In some embodiments, the carbon nanostructure includes a group having the following structure,

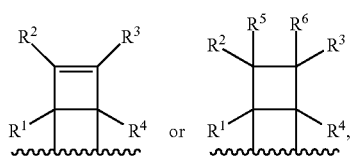

wherein "〰〰〰" comprises the fused network of aromatic rings of the carbon nanostructure; and $R^1$-$R^6$ can be the same or different and are hydrogen, hydroxyl, halo, alkyl, heteroalkyl, alkenyl, heteroalkenyl, aryl, heteroaryl, or heterocycle, any of which is optionally substituted, or any two of $R^1$-$R^6$ are joined to form an optionally substituted ring. In some cases, the cyclobutyl and/or cyclobutenyl group is substituted with an electron-donating group, including alkyl groups. In some cases, the cyclobutyl and/or cyclobutenyl group is not substituted with an electron-withdrawing group.

In one set of embodiments, the carbon nanostructure comprises the following structure,

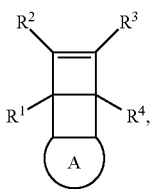

wherein:
A is a carbon nanostructure; and
$R^1$-$R^4$ can be the same or different and hydrogen, hydroxyl, halo, alkyl, heteroalkyl, alkenyl, heteroalkenyl, aryl, heteroaryl, or heterocycle, any of which is optionally substituted. In some cases, $R^1$-$R^4$ are alkyl, such as methyl, ethyl, propyl, butyl, pentyl, or hexyl. In some embodiments, $R^1$-$R^4$ are methyl. In some embodiments, at least one of $R^1$-$R^4$ is not hydrogen. In some embodiments, at least one of $R^1$-$R^6$ is not hydrogen.

In another set of embodiments, the carbon nanostructure comprises the following structure,

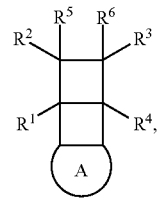

wherein:
A is a carbon nanostructure; and
$R^1$-$R^6$ can be the same or different and are hydrogen, hydroxyl, halo, alkyl, heteroalkyl, alkenyl, heteroalkenyl, aryl, heteroaryl, or heterocycle, any of which is optionally substituted, or any two of $R^1$-$R^6$ are joined to form an optionally substituted ring. In some cases, $R^1$-$R^4$ are alkyl, such as methyl, ethyl, propyl, butyl, pentyl, or hexyl. In some embodiments, $R^1$-$R^4$ are methyl. In some embodiments, $R^1$-$R^4$ are butyl. In some cases, $R^5$ and $R^6$ are joined to form an optionally substituted ring, such as an epoxide ring. In some embodiments, at least one of $R^1$-$R^4$ is not hydrogen. In some embodiments, at least one of $R^1$-$R^6$ is not hydrogen.

The carbon nanostructure may be, for example, a fullerene, a nanotube, graphene, or graphite. In some embodiments, the carbon nanostructure is a single-walled nanotube. In some embodiments, the carbon nanostructure is a multi-walled nanotube, such as a double-walled nanotube. In some embodiments, the carbon nanostructure is a fullerene. In some cases, the carbon nanostructure comprises one, two, three, four, or five optionally substituted cyclobutene groups. It should be understood that the carbon nanostructure can include any number of optionally substituted cyclobutene groups, and those of ordinary skill in the art would be capable of selecting the appropriate reaction conditions to produce a carbon nanostructure having the desired number of optionally substituted cyclobutene groups.

In some embodiments, the carbon nanostructure includes a cyclobutyl group substituted with at least one alkyl group. In some embodiments, the carbon nanostructure includes a cyclobutenyl group substituted with at least one alkyl group. In some embodiments, the carbon nanostructure is a fullerene that includes one, two, or three cyclobutyl groups substituted with at least one (e.g., four) alkyl group. In some embodiments, the carbon nanostructure includes is a fullerene that includes one two or three cyclobutenyl groups substituted with at least one (e.g., four) alkyl group.

In some embodiments, the composition comprising the functionalized carbon nanostructures may be provided as a solution. In some embodiments, the composition may be provided as a solid or a substantially solid substance (e.g., gel). For example, the composition may be formed as a solid-state film. The film may be formed using methods known in the art, including solution coating, ink jet printing, spin coating, dip coating, spray coating, and the like. In some embodiments, at least a portion of the film may have a thickness between about 1 nm and about 1 mm, or between about 1 nm and about 500 um, or between about 1 nm and about 500 nm, or between about 100 nm and about 500 nm, or between about 100 nm and about 300 nm. In one set of embodiments, at least a portion of the film has a thickness of 75 nm. Film thickness may be determined by methods known in the art, including ellipsometry. In some cases, the film thickness may be measured using ellipsometry on films, such as films prepared on silicon substrates.

In some cases, functionalizing a carbon nanostructure with a cyclobutenyl group as described herein may decrease the electron affinity of, and therefore increase the LUMO energy level of, the carbon nanostructure. In some cases, a carbon nanostructure substituted with a cyclobutenyl group, optionally substituted, may exhibit an increase in LUMO energy level of about 50 meV, about 100 meV (e.g., 90 meV), about 150 meV, about 200 meV, about 250 meV (e.g., 260 meV), about 300 meV, about 350 meV, about 400 meV, or about 450 meV, relative to the LUMO energy level of ([6,6]-phenyl-$C_{61}$-butyric acid methyl ester) (PCBM).

Compositions comprising a functionalized carbon nanostructure as described herein may be incorporated into a wide range of applications, including photovoltaic devices (e.g., solar cells), batteries, capacitors, transistors, catalyst systems, or chemical or biological sensors. The composition may be arranged in connection with an external source of energy, one or more electrodes, an electrolyte, separator materials, sample inlets and outlets, sample cells, substrates, detectors, power sources, and/or other device components suitable for a particular application. For example, the composition may be arranged to be in electrochemical communication with an electrode material, such that a potential or voltage may be applied to the composition. In some cases, the composition may be used as a photoactive material in a device. In some cases, the composition may be arranged to be exposed to a sample suspected of containing an analyte, such as a chemical or biological analyte. In some cases, the composition may be included in an electrode material for electrocatalysts.

In some cases, the device is a photovoltaic cell, such as a solar cell. Photovoltaic cells generally include a photoactive material containing an electron acceptor/electron donor material, and at least two electrodes (e.g., an anode and a cathode). The device may also include a substrate (e.g., on which to form the photoactive material, anode, and/or cathode), electron-blocking and/or electron-transporting membrane(s), circuitry, a power source, and/or an electromagnetic radiation source. In some cases, the composition including the functionalized carbon nanostructures may be used as an electron acceptor material or an n-type material in a photovoltaic device. For example, a photovoltaic device may include a photoactive material comprising an electron acceptor material that includes functionalized carbon nanostructures as described herein in contact with an electron donor material, where the photoactive material is placed in contact with two electrodes. The electron donor and electron acceptor materials may be arranged to form a bulk heterojunction and to have sufficient donor-acceptor interfacial area to favor exciton dissociation and efficient transport of separated charges to the respective electrodes. Those of ordinary skill in the art will be able to select suitable electron donor materials for use in the embodiments described herein. In some embodiments, the electron donor material may be a conducting polymer, such as a polythiophene.

The photovoltaic device may be exposed to light using methods known to those of ordinary skill in the art. The light may interact with the photoactive material, causing electrons to be transferred from the electron donor material (e.g., poly(thiophene)) to the n-type material or electron-acceptor material (e.g., functionalized carbon nanostructure). The electrons in the n-type material can be transported to the cathode and the corresponding holes can be transported to the anode via the electron donor material.

The components of the photovoltaic device may arranged in various configurations. In some cases, the electron acceptor material may be dispersed in clusters throughout the electron donor material. In some cases, the clusters may be substantially surrounded by an electron donor material. In some cases, the electron donor material and electron acceptor material may be randomly dispersed with respect to one another, thereby forming a heterogeneous material. In some cases, the electron donor material and/or the electron acceptor material can be formed as layers of films. In some cases, an array of different devices with different compositions and different morphologies or different layouts can be used.

Photovoltaic devices described herein may exhibit enhanced performance relative to previous photovoltaic devices. As described herein, incorporation of a carbon nanostructure containing a cyclobutyl and/or cyclobutenyl group may raise the LUMO level of the electron acceptor material, thereby enhancing open-circuit potential and efficiency of the device. In some embodiments, the photovoltaic device exhibits a higher efficiency relative to an essentially identical photovoltaic device lacking the cyclobutyl-containing species and/or cyclobutenyl-containing species, under essentially identical conditions. In some embodiments, the photovoltaic device exhibits an efficiency that is about 1%, about 3%, about 5%, about 10%, about 20%, about 30%, about 40%, about 50%, about 60%, about 70%, about 80%, about 90%, or, in some cases, about 100% greater than that of an essentially identical photovoltaic device lacking the cyclobutyl-containing species and/or cyclobutenyl-containing species, under essentially identical conditions.

In some embodiments, the photovoltaic device exhibits a higher open circuit potential relative to an essentially identical photovoltaic device lacking the cyclobutyl-containing species and/or cyclobutenyl-containing species, under essentially identical conditions. In some embodiments, the photovoltaic device exhibits an open circuit potential that is about 1%, about 3%, about 5%, about 10%, about 20%, about 30%, about 40%, about 50%, about 60%, about 70%, about 80%, about 90%, or, in some cases, about 100% greater than that of an essentially identical photovoltaic device lacking the cyclobutyl-containing species and/or cyclobutenyl-containing species, under essentially identical conditions.

Methods for synthesizing functionalized carbon nanostructures, as well as methods for incorporating such materials into devices, are provided. The method may involve reaction of a carbon nanostructure with a cyclobutenyl group precursor to produce a functionalized carbon nanostructure comprising an optionally substituted cyclobutenyl group. In some cases, the reaction involves a pericyclic reaction such as a Diels-Alder reaction. In some cases, the cyclobutenyl group precursor, or an intermediate produced by the cyclobutenyl group precursor, may act as a diene and the carbon nanostructure (e.g., fullerene) may serve as a dienophile in a Diels-Alder reaction. The reaction may be performed in the presence of an additive that may enhance and/or facilitate the pericyclic reaction.

For example, the reaction may be performed in the presence of a Lewis acid (e.g., $AlCl_3$). In some cases, the cyclobutenyl group precursor may form a zwitterionic intermediate species in the presence of a Lewis acid, which may then be treated (e.g., with dimethylsulfoxide) to generate a reactive diene species or a reactive alkene species. The reactive diene species or a reactive alkene species may then be exposed to the carbon nanostructure. Alternatively, the carbon nanostructure may first be combined with a Lewis acid, followed by exposure to the cyclobutenyl group precursor to generate the reactive components in situ.

Those of ordinary skill in the art would be capable of selecting the appropriate Lewis acid for use in a particular reaction. The Lewis acid may be a compound or complex that includes a metal (e.g., zinc, tin, aluminum, magnesium, scandium, titanium, nickel, scandium, magnesium, lanthanum, etc.) or a metalloid species (e.g., boron species), a halide, a triflate (e.g., a silyl triflate, tin triflate zinc triflate or scandium triflate), or the like. Some specific examples of Lewis acids include, but are not limited to, lithium bromide, lithium chloride, aluminum trichloride, $Et_2AlCl$, $EtAlCl_2$, $MgBr_2 \cdot OEt_2$, boron trifluoride, boron tribromide (e.g., $BF_3 \cdot OEt_2$), boron trichloride, boron trifluoride etherate, $SnCl_4$, zinc chloride, zinc iodide, zinc triflate, antimony pentachloride, $TiCl_4$, titanium isopropoxide, trimethylsilyl triflate (TMSOTf), $Sn(OTf)_2$, $Zn(OTf)_2$, $Sc(OTf)_3$, and the like. In one embodiment, the Lewis acid is aluminum trichloride.

Typically, the cyclobutenyl group precursor includes an alkyne species. In some embodiments, it may be desirable for the alkyne species to be substituted with at least one electron-donating group, such as an alkyl, heteroalkyl (e.g., alkoxy), amino, hydroxyl, and the like. For example, an electron-donating substituent on the alkyne species may facilitate a Diels-Alder reaction in which the alkyne species, or intermediate produced by the alkyne species, acts as the diene. In some cases, the alkyne species is not substituted with an electron-withdrawing group (e.g., a carbonyl group). In some cases, the alkyne species has the structure,

wherein $R^a$ and $R^b$ can be the same or different and are hydrogen, alkyl, or heteroaryl, any of which is optionally substituted. In some embodiments, at least one of $R^a$ and $R^b$ is not hydrogen. In some embodiments, $R^a$ and $R^b$ are both alkyl, such as methyl or butyl.

Other examples of reactions for forming cyclobutene groups are described in Yurovskaya et al., Russian Chemical Bulletin, International Edition 2002, 51(3), 367-443; Bally et al., Tetrahedron 1980, 36, 343-370; Maier, G., Angew. Chemie., Int. Ed. 1988, 27(3), 309-446; Driessen et al., J. Am. Chem. Soc. 1078, 100(4), 1193-1200; and Tet. Lett. 1995, 36(31), 5631-5632, the contents of which references are incorporated herein by reference in their entirety for all purposes.

Figure 2:
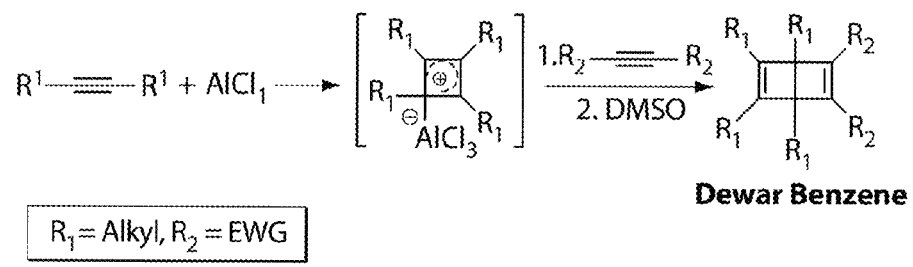
FIG. 2 shows the $AlCl_3$-assisted Diels-Alder reaction of alkynes.

In some embodiments, aluminum trichloride is reacted with an internal alkyne (e.g., a di-substituted alkyne) to generate a cyclobutadiene intermediate with a σ-bonded aluminum moiety, as shown in FIG. 2. The intermediate cyclobutadiene, upon liberation of aluminum chloride by addition of dimethylsulfoxide, may be reactive in [4+2] cycloaddition reactions (e.g., Diels-Alder reaction) either as a diene or as a reactive alkene, and may be exposed to a dienophile such as a carbon nanostructure. In an illustrative embodiment, a dialkyl alkyne species may be exposed to aluminum trichloride to generate an intermediate cyclobutadiene species, which may subsequently be treated with DMSO and then exposed to a dienophile such as $C_{60}$. New n-type $C_{60}$ derivatives can be created via Diels-Alder reactions with the in situ generated tetraalkylcyclobutadienes.

Figure 3A:
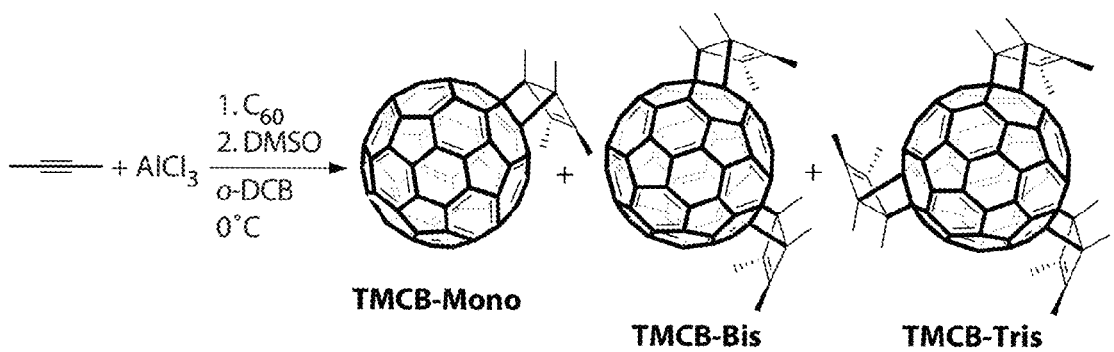
FIG. 3 shows (a) the synthesis of tetramethylcyclobutene-substituted fullerenes and (b) the synthesis of tetraalkylcyclobutene-substituted fullerenes.
Figure 3B:
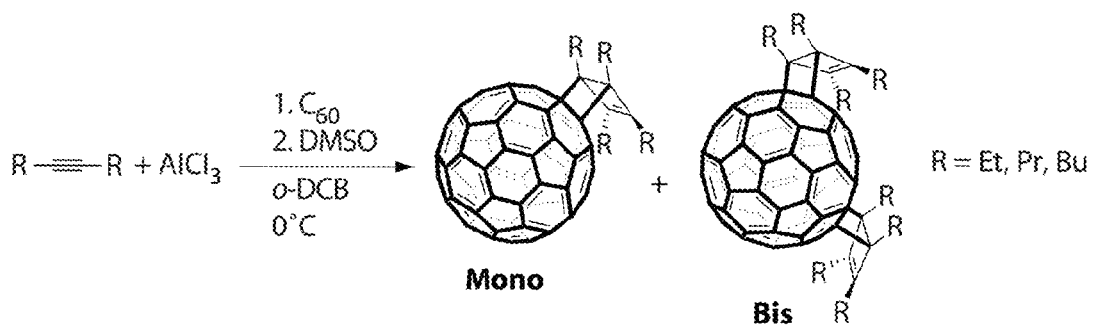

Those of ordinary skill in the art would be able to select the appropriate set of conditions under which to conduct the reaction to produce a particular desired product. The set of conditions may include, for example, a particular temperature, pH, solvent, chemical reagent, type of atmosphere (e.g., nitrogen, argon, oxygen, etc.), the presence or absence of water, the relative ratio of reagents used, reaction time, and/or the like. For example, the chemical stability of the reaction components may affect the selection of reaction conditions. In some cases, it may be advantageous to perform the reaction under substantially moisture-free conditions. In some cases, the reaction may advantageously be performed with relatively short reaction times (e.g., 2 hours or less) and/or at relatively low temperatures (e.g., between 0° C. and room temperature). In some cases, an excess of non-carbon nanostructure reagents (e.g., tens of equivalents of non-carbon nanostructure reagents, such as alkyne species and/or Lewis acids) may not be required to achieve high-yielding functionalization of the carbon nanostructure. For example, FIG. 3 illustrates the reaction of 2-butyne and aluminum chloride with $C_{60}$, followed by treatment with DMSO to produce tetramethylcyclobutene-$C_{60}$ mono-, bis-, and trisadduct. By varying the molar ratio of the alkyne, the Lewis acid (e.g., aluminum chloride), and the carbon nanostructure (e.g., $C_{60}$), it is possible to selectively increase the yield of each product in the mixture. In an illustrative embodiment, four equivalents of 2-butyne, which generate two equivalents of a cyclobutene moiety relative to $C_{60}$, was used to produce 32% mono-cyclobutene-substituted $C_{60}$ and 16.5% bis-cyclobutene-substituted $C_{60}$, while eight equivalents of 2-butyne, which generates four equivalents of a cyclobutene moiety, gave rise to 8% tris-cyclobutene-substituted $C_{60}$.

As described herein, the functionalized carbon nanostructure may be further reacted to attach additional functional groups and/or replace existing functional groups with new atoms or groups. That is, at least one atom or chemical group of the functionalized carbon nanostructure may be replaced with a second, different atom or chemical group, or at least one atom or chemical group of the functionalized carbon nanostructure may be linked to a second, different atom or chemical group. In some embodiments, the carbon nanostructure may be first functionalized with a cyclobutenyl group, which may be further reacted, for example, via the double bond of the cyclobutenyl group. In some cases, a cyclobutenyl group of a functionalized carbon nanostructure may be converted into a substituted cyclobutyl group.

Further functionalization or reaction of the functionalized carbon nanostructure (e.g., via the cyclobutenyl group) may be performed using various chemical reactions known in the art, where reaction components are selected to react together in a manner that produces a desired chemical bond. Such reactions are known in the art, for example, in "Advanced Organic Chemistry" by Carey and Sundberg and in "Advanced Organic Chemistry" by Jerry March, the contents of which are incorporated herein by reference. Some specific examples of reactions that may be useful in methods described herein include substitutions, eliminations, additions, condensations, aromatic substitutions, pericyclic reactions and cycloadditions, photochemical reactions, thermal reactions, Wittig reactions, metal-catalyzed reactions, rearrangement reactions, reductions, oxidations, and the like. In some cases, a functionalized carbon nanostructure may be reacted via heating, exposure to acid or base, or via a photochemical reaction.

In some embodiments, the method may involve reacting the functionalized carbon nanostructure under conditions which result in the conversion of the cyclobutenyl group to an optionally substituted cyclobutyl group. For example, the functionalized carbon nanostructure may be exposed to a peroxide-containing reagent, resulting in epoxidation of the cyclobutenyl group. Various peroxide-containing reagents are known in the art, including 3-chloroperbenzoic acid.

In some embodiments, the method may involve reacting the functionalized carbon nanostructure under conditions which result in the occurrence of a cycloreversion reaction of the functionalized carbon nanostructure, such that an alkene species is generated. In some cases, the cycloreversion involves a retro-Diels-Alder reaction. The alkene species generated may be an isolated alkene and may no longer form a bond with the carbon nanostructure. The facile and reversible functionalization of carbon nanostructures may be useful in applications such as exfoliation or deaggregation of carbon nanostructures. For example, carbon nanostructures, such as graphite, can be functionalized to de-aggregate individual nanostructures (e.g., graphene sheets), which can then be isolated and de-functionalized, if desired.

Chemical reactions may be selected to be compatible with (e.g., inert to) other functional groups that may be present during the reaction. In some embodiments, the chemical reaction may be selected to be compatible with carbon nanostructures. In some embodiments, protecting groups may be used to prevent reaction at sites other than the desired reactive site. The phrase "protecting group" as used herein refers to temporary substituents which protect a potentially reactive functional group from undesired chemical transformations. Examples of such protecting groups include esters of carboxylic acids, silyl ethers of alcohols, and acetals and ketals of aldehydes and ketones, respectively. The field of protecting group chemistry has been reviewed (Greene, T. W.; Wuts, P. G. M. Protective Groups in Organic Synthesis, 2nd ed.; Wiley: New York, 1991). In some cases, protecting groups may impart other beneficial characteristics, including improved solubility of a compound in a particular solvent.

As noted herein, electron donor materials used in photovoltaic devices may include a conducting polymer. Conducting polymers refer to extended molecular structures comprising a conjugated backbone (e.g., pi-conjugated backbone, sigma-conjugated backbone, etc.), where "backbone" refers to the longest continuous bond pathway of the polymer. Polymers may also include oligomers. Typically, conducting polymers include at least one portion along which electron density or electronic charge can be conducted, where the electronic charge is delocalized. For example, in pi-conjugated systems, p-orbitals of one monomer have sufficient overlap with p-orbitals of an adjacent monomer such that electronic charge may be delocalized. In some cases, a conjugated pi-backbone includes a plane of atoms directly participating in the conjugation, wherein the plane arises from a preferred arrangement of p-orbitals to maximize p-orbital overlap, thus maximizing conjugation and electronic conduction. The conducting polymer may be a homopolymer, a copolymer including random copolymers and block copolymers, and the like. Examples of conducting polymers include polyaniline, polythiophene, polypyrrole, polyphenylene, polyarylene, poly(bisthiophene phenylene), a ladder polymer, poly(arylene vinylene), poly(arylene ethynylene), metal derivatives thereof, or substituted derivatives thereof.

In some embodiments, the conducting polymer may be polythiophene or a substituted derivative thereof. Poly(thiophenes) generally contain the repeating unit:

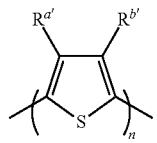

wherein $R^{a'}$ and $R^{b'}$ can be the same or different and each can independently be hydrogen, alkyl, heteroalkyl aryl, heteroaryl, arylalkyl, arylheteroalkyl, heteroarylalkyl, each optionally substituted; and n can be any integer between 2 and 100,000,000. In some embodiments, at least one of $R^{a'}$ and $R^{b'}$ is not hydrogen. In some cases, the polythiophene has the structure,

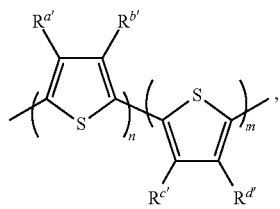

wherein $R^{a'}$, $R^{b'}$, $R^{c'}$, and $R^{d'}$ can be the same or different and each can independently be hydrogen, alkyl, heteroalkyl aryl, heteroaryl, arylalkyl, arylheteroalkyl, heteroarylalkyl, each optionally substituted; and n and m can be the same or different and can be any integer between 2 and 100,000,000. Examples of poly(thiophenes) include alkyl-substituted poly(thiophene)s (e.g., poly(3-hexylthiophene), poly(3,4-ethylenedioxythiophene) (PEDOT), etc.). In an illustrative embodiment, the polymer is poly(3-hexylthiophene).

In some cases, a photovoltaic cell comprises a composition useful as a photoactive layer in a bulk heterojunction solar cell. In some cases, the composition may comprise a conducting polymer (e.g., poly(3-hexylthiophene or P3HT) as an electron donor material and a carbon nanostructure, or derivative thereof, as an electron acceptor material.

The ratio of electron donor material to total electron acceptor material may be varied to suit a particular application. In some cases, the photoactive layer comprises a greater amount of electron donor material relative to total electron acceptor material, by weight. In some cases, the photoactive layer comprises a greater amount of total electron acceptor material relative to electron donor material, by weight. In some cases, the photoactive layer comprises essentially equal amounts of electron donor material relative to total electron acceptor material, by weight.

Various components of the device, such as the sample cells, electrodes, power source, electrolyte, separator, container, circuitry, insulating material, gate electrode, etc. can be fabricated and/or selected by those of ordinary skill in the art. Components may be molded, machined, extruded, pressed, isopressed, infiltrated, coated, in green or fired states, or formed by any other suitable technique. Those of ordinary skill in the art are readily aware of techniques for forming components of devices herein.

Those of ordinary skill in the art would be able to select materials suitable for use as electrodes in the context of embodiments described herein. In some cases, the electrode material may comprise calcium, aluminum, silver, lithium fluoride, or the like.

Devices disclosed herein may include a sample cell within or on which the composition is arranged. In some cases, the sample cell may be a capillary-shaped sample cell containing the composition in solution form. In some cases, the sample cell may be a substrate on which the composition is formed (e.g., as a film). The substrate can be any material capable of supporting the device components described herein. That is, the substrate may be any material to which the composition, electron acceptor material, electron donor material, electrode material, or other compositions described herein, may adhere. The substrate may be selected to have a thermal coefficient of expansion similar to those of the other components of the device to promote adhesion and prevent separation of the device components at various temperatures. In some instances, materials with dissimilar thermal expansion coefficients may expand and contract at different rates and amounts with changes in temperature, which can cause stress and separation of the device components.

In some cases, the substrate may comprise an electrically conductive material. In some cases, the substrate may comprise a material coated with an electrically conductive material, such that the photoactive material may be formed in contact with the electrically conductive material. Examples of materials suitable for use as a substrate include, but are not limited to, metals, such as nickel, chromium, gold, molybdenum, tungsten, platinum, titanium, aluminum, copper, palladium, silver, other metals and/or metal compounds, alloys thereof, intermetallic compounds thereof, and the like. Other materials may also be useful, including indium tin oxide (ITO).

The substrate may also comprise a flexible material, such as plastics (e.g., polymer), polymer films, flexible glass films, metal foil, paper, woven materials, combinations thereof, and the like. The substrate may be a flexible material coated with an electrically conductive material, for example. The substrate may be prepared, for example, by one of a number of micromachining methods known to those skilled in the art. Examples of such methods include, for instance, photofabrication, etching, electrodischarge machining, electrochemical machining, laser beam machining, wire electrical discharge grinding, focused ion beam machining, micromilling, micro-ultrasonic machining, and micropunching. The dimensions of the substrate may be any length, width, and thickness that is desired for a particular end use and may be rectangular, circular or otherwise shaped.

As used herein, a "carbon-based nanostructure" refers to a carbon-containing structure comprising a fused network of rings, such as aromatic rings. In some embodiments, the carbon-based nanostructure comprises a fused network of at least 10, at least 20, at least 30, at least 40, or, in some cases, at least 50 rings, at least 60 rings, at least 70 rings, at least 80 rings, at least 100 rings, or more. The carbon-based nanostructure may be substantially planar or substantially non-planar, or may comprise planar and/or non-planar portions. The carbon-based nanostructure may optionally comprise a border at which the fused network terminates. For example, a sheet of graphite is a planar carbon-based nanostructure comprising a border at which the fused network terminates, while a fullerene is a nonplanar carbon-based nanostructure which lacks such a border. In some cases, the border may be substituted with hydrogen atoms. In some cases, the border may be substituted with groups comprising oxygen atoms (e.g., hydroxyl). In other cases, the border may be substituted as described herein. The term "fused network" might not include, for example, a biphenyl group, wherein two phenyl rings are joined by a single bond and are not fused. In some cases, the fused network may substantially comprise carbon atoms. In some cases, the fused network may comprise carbon atoms and heteroatoms. Some examples of carbon-based nanostructures include graphene, carbon nanotubes (e.g., single-walled carbon nanotubes (SWCNTs) and multi-walled carbon nanotubes (MW-CNTs)), fullerenes, and the like.

In some cases, the carbon-based nanostructure has an average maximum cross-sectional dimension of no more than about 1000 nm. In some cases, however, the maximum cross-sectional dimension may be greater than about 1000 nm, for example, the carbon-based nanostructure has an average maximum cross-sectional dimension of no more than about 1 µm, about 2 µm, about 3 µm, about 4 µm, about 5 µm, about 10 µm, or greater. In some embodiments, the carbon-based nanostructure may comprise at least about 30%, at least about 40%, at least about 50%, at least about 60%, at least about 70%, at least about 80%, at least about 90%, or at least about 95% of carbon by mass, or more. As used herein, the "maximum cross-sectional dimension" refers to the largest distance between two opposed boundaries of an individual structure that may be measured.

In some cases, the carbon-based nanostructure may comprise a nonplanar portion, e.g., a curved portion having a convex surface and a concave surface (where "surface," in this context, defines a side of a molecule or sheet defining a carbon-based nanostructure). Examples of carbon-based nanostructures comprising non-planar portions include fullerenes, carbon nanotubes, and fragments thereof, such as corannulene. In some cases, the nonplanar aromatic portion may comprise carbon atoms having a hybridization of $sp^{2-x}$, wherein x is between 1 and 9, i.e., the carbon atom may have hybridization between $sp^2$- and $sp^3$-hybridization, where this hybridization is characteristic of non-planarity of the molecule as would be understood by those of ordinary skill in the art. In these embodiments, x can also be between 2 and 8, between 3 and 7, or between 4 and 6. Typically, planar aromatic groups and polycyclic aromatic groups (e.g., phenyl, naphthyl) may comprise carbon atoms having $sp^2$ hybridization, while nonaromatic, non-planar groups (e.g., alkyl groups) may comprise carbon atoms having sp³ hybridization. For carbon atoms in a nonplanar aromatic group, such as a nonplanar portion of a carbon-based nanostructure, sp²-hybridized carbon atoms may be distorted (e.g., bent) to form the nonplanar or curved portion of a carbon-based nanostructure. Without wishing to be bound by theory, this distortion may cause angle strain and may alter the hybridization of the carbon atoms. As a result, the reactivity of the strained carbon atoms may be enhanced.

In some cases, the carbon-based nanostructure may comprise an elongated chemical structure having a diameter on the order of nanometers and a length on the order of microns (e.g., tens or microns, hundreds of microns, etc.), resulting in an aspect ratio greater than 10, 100, 1000, 10,000, or greater. In some cases, the carbon-based nanostructure may have a diameter less than 1 µm, less than 100 nm, 50 nm, less than 25 nm, less than 10 nm, or, in some cases, less than 1 nm. For example, the carbon-based nanostructure may have a cylindrical or pseudo-cylindrical shape (e.g., carbon nanotube).

In some cases, the carbon-based nanostructure is a carbon nanotube. As used herein, the term "carbon nanotube" is given its ordinary meaning in the art and refers to a substantially cylindrical molecule comprising a fused network of six-membered aromatic rings. In some cases, carbon nanotubes may resemble a sheet of graphite rolled up into a seamless cylindrical structure. It should be understood that the carbon nanotube may also comprise rings other than six-membered rings. Typically, at least one end of the carbon nanotube may be capped, i.e., with a curved or nonplanar aromatic group. Carbon nanotubes may have a diameter of the order of nanometers and a length on the order of micrometers, resulting in an aspect ratio greater than 100, 1000, 10,000, or greater. The term "carbon nanotube" includes single-walled nanotubes (SWCNTs), multi-walled nanotubes (MWCNTs) (e.g., concentric carbon nanotubes), inorganic derivatives thereof, and the like. In some embodiments, the carbon nanotube is a single-walled carbon nanotube. In some cases, the carbon nanotube is a multi-walled carbon nanotube (e.g., a double-walled carbon nanotube).

In some cases, the carbon-based nanostructure is a fullerene. As used herein, the term "fullerene" is given its ordinary meaning in the art and refers to a substantially spherical molecule generally comprising a fused network of five-membered and/or six-membered aromatic rings. For example, $C_{60}$ is a fullerene which mimics the shape of a soccer ball. The term fullerene may also include molecules having a shape that is related to a spherical shape, such as an ellipsoid. It should be understood that fullerenes may comprise rings other than five- or six-membered rings. In some embodiments, the fullerene may comprise seven-membered rings, or larger. Fullerenes may include $C_{36}$, $C_{50}$, $C_{60}$, $C_{70}$, $C_{76}$, $C_{84}$, and the like.

The term "electron-donating group," as used herein, refers to a functionality which draws electrons to itself less than a hydrogen atom would at the same position. Exemplary electron-donating groups include alkyl, amino, methoxy, and the like.

The term "electron-withdrawing group" is recognized in the art and as used herein means a functionality which draws electrons to itself more than a hydrogen atom would at the same position. Exemplary electron-withdrawing groups include nitro, cyano, carbonyl groups (e.g., aldehydes, ketones, esters, etc.), sulfonyl, trifluoromethyl, and the like.

As used herein, the term "react" or "reacting" refers to the formation of a bond between two or more components to produce a stable, isolable compound. For example, a first component and a second component may react to form one reaction product comprising the first component and the second component joined by a covalent bond. The term "reacting" may also include the use of solvents, catalysts, bases, ligands, or other materials which may serve to promote the occurrence of the reaction between component(s). A "stable, isolable compound" refers to isolated reaction products and does not refer to unstable intermediates or transition states.

The term "alkyl" refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. The alkyl groups may be optionally substituted, as described more fully below. Examples of alkyl groups include, but are not limited to, methyl, ethyl, propyl, isopropyl, butyl, isobutyl, tert-butyl, 2-ethylhexyl, cyclopropyl, cyclobutyl, cyclopentyl, cyclohexyl, and the like. "Heteroalkyl" groups are alkyl groups wherein at least one atom is a heteroatom (e.g., oxygen, sulfur, nitrogen, phosphorus, etc.), with the remainder of the atoms being carbon atoms. Examples of heteroalkyl groups include, but are not limited to, alkoxy, poly(ethylene glycol)-, alkyl-substituted amino, tetrahydrofuranyl, piperidinyl, morpholinyl, etc.

The terms "alkenyl" and "alkynyl" refer to unsaturated aliphatic groups analogous to the alkyl groups described above, but containing at least one double or triple bond respectively. The "heteroalkenyl" and "heteroalkynyl" refer to alkenyl and alkynyl groups as described herein in which one or more atoms is a heteroatom (e.g., oxygen, nitrogen, sulfur, and the like).

The term "aryl" refers to an aromatic carbocyclic group having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl), all optionally substituted. "Heteroaryl" groups are aryl groups wherein at least one ring atom in the aromatic ring is a heteroatom, with the remainder of the ring atoms being carbon atoms. Examples of heteroaryl groups include furanyl, thienyl, pyridyl, pyrrolyl, N-lower alkyl pyrrolyl, pyridyl-N-oxide, pyrimidyl, pyrazinyl, imidazolyl, indolyl and the like, all optionally substituted.

The terms "amine" and "amino" refer to both unsubstituted and substituted amines, e.g., a moiety that can be represented by the general formula: N(R')(R")(R'") wherein R', R", and R'" each independently represent a group permitted by the rules of valence.

The terms "acyl," "carboxyl group," or "carbonyl group" are recognized in the art and can include such moieties as can be represented by the general formula:

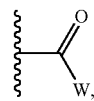

wherein W is H, OH, O-alkyl, O-alkenyl, or a salt thereof. Where W is O-alkyl, the formula represents an "ester." Where W is OH, the formula represents a "carboxylic acid." In general, where the oxygen atom of the above formula is replaced by sulfur, the formula represents a "thiocarbonyl" group. Where W is a S-alkyl, the formula represents a "thioester." Where W is SH, the formula represents a "thiolcarboxylic acid." On the other hand, where W is alkyl, the above formula represents a "ketone" group. Where W is hydrogen, the above formula represents an "aldehyde" group.

The term "substituted" is contemplated to include all permissible substituents of organic compounds, "permissible" being in the context of the chemical rules of valence known to those of ordinary skill in the art. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl" must still comprise the phenyl moiety and cannot be modified by substitution, in this definition, to become, e.g., a heteroaryl group such as pyridine. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

Examples of substituents include, but are not limited to, alkyl, aryl, aralkyl, cyclic alkyl, heterocycloalkyl, hydroxy, alkoxy, aryloxy, perhaloalkoxy, aralkoxy, heteroaryl, heteroaryloxy, heteroarylalkyl, heteroaralkoxy, azido, amino, halogen, alkylthio, oxo, acylalkyl, carboxy esters, carboxyl, carboxamido, nitro, acyloxy, aminoalkyl, alkylaminoaryl, alkylaryl, alkylaminoalkyl, alkoxyaryl, arylamino, aralkylamino, alkylsulfonyl, carboxamidoalkylaryl, carboxamidoaryl, hydroxyalkyl, haloalkyl, alkylaminoalkylcarboxy, aminocarboxamidoalkyl, alkoxyalkyl, perhaloalkyl, arylalkyloxyalkyl, and the like.

EXAMPLES

Materials and Methods.

$C_{60}$ was purchased from SES Research, and aluminum chloride and alkynes were purchased from Sigma-Aldrich and used as received. Other materials including solvents and electrolyte salt were commercially available. Anhydrous solvents were obtained from a solvent purification system (Innovative Technologies).

Reaction mixtures containing multiadducts of fullerenes were separated by 5PBB Cosmosil column (10 mm×250 mm) from Nacalai Tesque, Inc. installed in Agilent Technologies ProsStar 210 High Pressure Liquid Chromatography (HPLC) system. $^1$H and $^{13}$C NMR spectra were taken on Varian Inova-500 spectrometers. Chemical shifts were reported in ppm and referenced to residual solvent peaks (CDCl$_3$: 7.26 ppm for $^1$H, 77.20 ppm for $^{13}$C). Thermally assisted direct analysis in real time (TA-DART) high resolution mass spectrometry (HRMS) was measured on LCQ DECA (Thermo-Finnigan LLC) with ID-CUBE source (Ion-Sense, Inc.). Capillary temperature was 200° C., and the capillary voltage was set to 15V in positive-ion mode. Helium was used as the ionization gas. Bruker Daltonics Omniflex MALDI-TOF mass spectrometer was also used for mass determination. The matrix was prepared following a literature procedure, containing 7,7,8,8,-tetracyanquinodimethane in THF (10 mg/mL) with 1% silver trifluoroacetate as a promoter. Molecules were dissolved in THF to 0.1 mg/mL concentration and 2 μL of the solution was mixed with 20 μL of matrix. UV-vis absorption spectra were obtained using Agilent 8453 diode-array spectrophotometer. Electrochemical measurements were carried out in a glove box under nitrogen, using an Autolab PGSTAT 10 or PGSTAT 20 potentiostat (Eco Chemie) in a three electrode cell configuration. A Pt button (1.6 mm in diameter) electrode, a Pt wire, and a quasi-internal Ag wire submerged in 0.01M AgNO$_3$/0.1M tetrabutylammonium hexafluorophosphate (TBAPF$_6$) in acetonitrile were used as a working electrode, a counter electrode, and a reference electrode, respectively, in 0.1M TBAPF$_6$ toluene/acetonitrile (4:1) solution. The ferrocene/ferrocenium (Fc/Fc$^+$) redox couple was used as an internal standard, with the half-wave potentials observed between 0.195-0.203 V vs Ag/Ag$^+$ in toluene/acetonitrile (4:1) solution. Differential Scanning Calorimetry (DSC) was measured on a TA Instruments Q1000 DSC at scan rate of 10° C./min over the range of 25° C. to 200° C. or 35° C. to 200° C. Thermogravimetric Analyses were performed with a TGA Q50 apparatus (TA Instruments) under nitrogen. Samples were heated at 10° C./min from 30° C. to 800° C. X-ray diffraction was measured using Cu Kα radiation on an Inel CPS 120 position-sensitive detector with a XRG 3000 generator using aluminum substrate during ca. 20 minute collection time. Gaussian 03 software package was used for the structure optimization and the frequency calculation at the DFT level. B3LYP functional/6-31G (d,p) basis set was used for the computation.

Example 1

The following example describes the synthesis of fullerenes substituted with one or two tetramethylcyclobutene groups (TMCB-Mono and TMCB-Bis). In a flame dried 100 mL Schlenk flask, AlCl$_3$ (148 mg, 1.11 mmol) was dissolved in dry o-dichlorobenzene (o-DCB) 10 mL and stirred at 0° C. under Ar. 2-Butyne (174 μL, 2.22 mmol) was added to the solution dropwise, and then 20 mL o-DCB solution of C$_{60}$ (400 mg, 0.555 mmol) was added. After 1 hour of stirring to ensure formation of homogeneous phase, DMSO (0.2 mL, 2.33 mmol) was added dropwise and the solution was slowly warmed up to room temperature. 50 mL of ethanol was poured, and the precipitate was filtered and washed with ethanol several times, and then dissolved in 100 mL of toluene/hexane (1:1). The solution was passed through 5 cm silica gel pad, and concentrated in vacuo. Monoadduct and Bisadduct were separated by 5PBB Cosmosil column in toluene (4 mL/min) with yields of 31.9% (146.6 mg) and 16.5% (86.0 mg), respectively. TMCB-Mono $^1$H NMR (500 MHz, CDCl$_3$): δ (ppm) 2.07 (s, 6H), 1.97 (s, 6H). $^{13}$C NMR (500 MHz, CDCl$_3$): δ (ppm) 154.62 (2C), 154.21 (2C), 147.24 (2C), 146.94 (2C), 146.91 (2C), 146.22 (2C), 146.14 (2C), 146.06 (2C), 145.53 (1C), 145.46 (2C), 145.39 (2C), 145.37 (2C), 145.35 (2C), 145.26 (2C), 144.69 (2C), 144.58 (2C), 143.21 (1C), 143.05 (2C), 142.79 (2C), 142.49 (2C), 142.35 (2C), 142.31 (2C), 142.25 (2C), 142.11 (2C), 140.43 (2C), 140.37 (2C), 139.06 (2C), 137.75 (2C), 129.22 (1C), 128.41 (1C), 74.38 (2C), 60.38 (2C), 53.62 (2C), 14.07 (2C), 11.56 (2C).

TMCB-Bis $^1$H NMR (500 MHz, CDCl$_3$): δ (ppm) 2.22 (m, 3H), 2.05 (m, 3H), 2.03-2.02 (m, 3H), 1.98 (m, 3H), 1.89 (s, 3H), 1.85-1.84 (m, 3H), 1.75 (m, 3H), 1.66-1.64 (m, 3H). $^{13}$C NMR (500 MHz, CDCl$_3$): δ (ppm) 157.49 (1C), 157.32 (1C), 155.46 (1C), 155.14 (1C), 155.10 (1C), 154.74 (1C), 154.62 (1C), 154.51 (1C), 154.44 (1C), 149.94 (1C), 149.91

(1C), 149.82 (1C), 149.60 (1C), 148.73 (1C), 148.71 (1C), 146.64 (1C), 148.26 (1C), 148.05 (1C), 147.91 (1C), 147.86 (1C), 147.75 (1C), 147.57 (1C), 147.28 (1C), 146.16 (1C), 145.97 (1C), 145.90 (1C), 145.77 (1C), 145.75 (1C), 145.59 (1C), 145.20 (1C), 145.04 (1C), 144.76 (1C), 144.72 (1C), 144.59 (1C), 144.02 (1C), 143.72 (1C), 143.60 (1C), 142.66 (1C), 142.58 (1C), 142.55 (1C), 141.50 (1C), 141.43 (1C), 141.36 (1C), 141.24 (1C), 140.72 (1C), 139.99 (1C), 139.19 (1C), 138.62 (1C), 138.52 (1C), 138.06 (1C), 137.85 (1C), 137.16 (1C), 137.05 (1C), 129.22 (1C), 128.41 (1C), 125.49 (1C), 60.46 (4C), 60.10 (4C), 60.01 (4C), 13.98 (2C), 13.87 (2C), 11.74 (1C), 11.49 (1C), 11.42 (1C), 11.24 (1C).

ESI MS: Monoadduct (calcd for $C_{68}H_{12}$ [M+H]$^+$ 829.1012. Found 829.04), Bisadduct (calcd for $C_{76}H_{24}$ [M]$^+$ 937.0060. Found 936.99).

Example 2

The following example describes the synthesis of fullerenes substituted with three tetramethylcyclobutene groups (TMCB-Tris). In a flame dried 200 mL Schlenk flask, $AlCl_3$ (741 mg, 5.56 mmol) was dissolved in dry o-DCB 25 mL and stirred at 0° C. under Ar. 2-Butyne (0.88 mL, 11.1 mmol) was added to the solution dropwise, and then 50 mL o-DCB solution of $C_{60}$ (1.0 g, 1.39 mmol) was added. After 1 hour of stirring, DMSO (0.89 mL, 11.4 mmol) was added dropwise and the solution was slowly warmed up to room temperature. 100 mL of ethanol was poured, and the precipitate was filtered and washed with ethanol several times, and then dissolved in 250 mL of toluene/hexane (1:1). The solution was passed through 5 cm silica gel pad, and concentrated in vacuo. 115 mg (7.9%) of the product was obtained after purification by 5PBB Cosmosil column in toluene (4 mL/min). $^1$H NMR (500 MHz, CDCl$_3$): δ (ppm) 2.16-1.57 (m, 36H). $^{13}$C NMR (500 MHz, CDCl$_3$): δ (ppm) 157.81 (2C), 157.68 (2C), 157.61 (2C), 155.49 (2C), 155.20 (2C), 155.09 (2C), 154.94 (2C), 154.57 (2C), 152.81 (2C), 151.51 (2C), 151.11 (2C), 149.70 (2C), 149.64 (2C), 149.57 (2C), 149.52 (2C), 149.45 (2C), 149.06 (2C), 148.94 (2C), 144.54 (2C), 144.84 (2C), 144.26 (2C), 144.23 (2C), 115.33 (2C), 115.18 (2C), 114.84 (2C), 114.73 (2C), 99.99 (2C), 59.90 (6C), 59.29 (6C), 29.91 (6C), 14.15 (2C), 13.86 (2C), 13.77 (2C), 11.65 (2C), 11.41 (2C), 11.36 (2C). MALDI-TOF MS: calcd for $C_{84}H_{36}$ [M]$^+$ 1045.1871. Found 1045.22.

Example 3

The following example describes the epoxidation of a tetramethylcyclobutene-substituted fullerene. TMCB-Mono (102 mg, 0.123 mmol) was dissolved in 15 mL chloroform in a 50 mL round-bottom flask in which a solution of 3-chloroperbenzoic acid (max. 77% purity, 76 mg, 0.339 mmol) in 5 ml chloroform was added dropwise at 0° C. The solution was slowly warmed up to room temperature during 7 hours of stirring, and a major product spot was detected on a TLC plate. The reaction mixture was diluted with 75 mL of dichloromethane, and extracted with NaOH aqueous solution several times. The organic layer was dried with MgSO$_4$ and concentrated in vacuo. 100 mg (96.1%) of the product (TMCB-Ep) was isolated after gradient silica column with 1:13 to 1:1 toluene/hexane eluent. $^1$H NMR (500 MHz, CDCl$_3$): δ (ppm) 1.98 (s, 6H), 1.87 (s, 6H). $^{13}$C NMR (500 MHz, CDCl$_3$): δ (ppm) 153.77 (2C), 153.69 (2C), 147.20 (2C), 146.76 (2C), 146.57 (2C), 146.30 (2C), 146.22 (2C), 146.21 (4C), 145.69 (1C), 145.55 (1C), 145.51 (2C), 145.43 (1C), 145.39 (2C), 144.75 (1C), 144.70 (2C), 143.35 (1C), 143.34 (1C), 142.94 (2C), 142.90 (2C), 142.55 (2C), 142.49 (2C), 142.26 (2C), 142.10 (2C), 142.19 (2C), 141.87 (2C), 140.64 (2C), 140.62 (2C), 138.87 (2C), 137.31 (2C), 71.38 (2C), 71.20 (2C), 62.46 (2C), 29.90 (2C), 12.87 (2C), 12.12 (2C).

ESI MS: calcd for $C_{68}H_{12}O$ [M+H]$^+$ 845.0961. Found 845.12.

Example 4

The following example describes the synthesis of fullerenes substituted with one or two tetrabutylcyclobutenes (TBCB-Mono and TBCB-Bis). In a flame dried 50 mL Schlenk flask, $AlCl_3$ (150 mg, 1.12 mmol) was dissolved in dry o-DCB 15 mL and stirred at 0° C. under Ar. 5-Decyne (0.41 mL, 2.28 mmol) was added to the solution dropwise, and then 50 mL o-DCB solution of $C_{60}$ (200 mg, 0.28 mmol) was added. After 1 hour of stirring, DMSO (0.2 mL, 2.33 mmol) was added dropwise and the solution was slowly warmed up to room temperature. 35 mL of ethanol was poured, and the precipitate was filtered and washed with ethanol several times, and then dissolved in 150 mL of toluene/hexane (1:4). The solution was passed through 5 cm silica gel pad, and concentrated in vacuo. Monoadduct and Bisadduct were separated by 5PBB Cosmosil column in toluene (4 mL/min) with yields of 40.1% (111.1 mg) and 24.1% (85.1 mg), respectively. 17.7% (35.5 mg) of $C_{60}$ was recovered.

TBCB-Mono $^1$H NMR (500 MHz, CDCl$_3$/CS$_2$ 1:1): δ (ppm) 2.69-2.63 (m, 4H), 2.47-2.41 (m, 2H), 2.30-2.24 (m, 2H), 2.02-1.98 (m, 2H), 1.91-1.73 (m, 6H), 1.54-1.50 (m, 8H), 1.04-1.01 (t, 12H). $^{13}$C NMR (500 MHz, CDCl$_3$/CS$_2$ 1:1): δ (ppm) 155.19 (2C), 153.81 (2C), 149.58 (2C), 147.25 (2C), 146.71 (2C), 146.23 (2C), 146.06 (2C), 145.99 (2C), 145.96 (2C), 146.87 (2C), 145.33 (2C), 145.18 (2C), 145.16 (2C), 144.53 (2C), 144.41 (2C), 143.08 (2C), 143.03 (1C), 142.89 (1C), 142.74 (2C), 142.71 (2C), 142.62 (2C), 142.31 (2C), 142.19 (2C), 142.09 (2C), 142.08 (2C), 141.95 (2C), 140.30 (2C), 140.09 (2C), 138.77 (2C), 137.78 (2C), 73.98 (2C), 64.00 (4C), 31.46 (2C), 31.43 (2C), 29.51 (2C), 28.90 (2C), 24.34 (2C), 23.83 (2C), 14.31 (2C), 14.28 (2C).

TBCB-Bis $^1$H NMR (500 MHz, CDCl$_3$/CS$_2$ 1:1): δ (ppm) 2.55-1.34 (m, 42H), 1.01-0.90 (m, 24H). $^{13}$C NMR (500 MHz, CDCl$_3$/CS$_2$ 1:1): δ (ppm) 157.71 (2C), 157.67 (2C), 156.63 (2C), 155.55 (2C), 154.62 (2C), 154.05 (2C), 153.75 (2C), 153.56 (2C), 152.15 (2C), 149.32 (2C), 148.98 (2C), 148.87 (2C), 148.47 (2C), 147.69 (2C), 147.11 (2C), 146.16 (2C), 145.00 (2C), 144.90 (2C), 144.85 (2C), 144.41 (2C), 144.27 (2C), 143.61 (2C), 142.57 (2C), 141.21 (2C), 141.14 (2C), 139.55 (2C), 138.83 (2C), 137.31 (2C), 63.55 (2C), 63.54 (2C), 31.40 (2C), 31.37 (2C), 31.26 (2C), 31.19 (2C), 30.03 (2C), 29.50 (2C), 29.38 (2C), 28.92 (2C), 28.87 (2C), 28.72 (2C), 24.56 (2C), 24.38 (2C), 24.30 (2C), 23.83 (2C), 23.71 (2C), 23.65 (2C), 14.37 (2C), 14.32 (2C), 14.28 (2C), 14.19 (2C).

ESI MS: calcd for $C_{80}H_{36}$ [M+H]$^+$ 997.2890. Found 997.23.

MALDI-TOF MS: calcd for $C_{100}H_{72}$ [M]$^+$ 1273.6448. Found 1273.62.

Example 5

The following example describes the fabrication and study of a device that includes fullerenes substituted with one or more tetraalkylcyclobutenes. Pre-patterned indium tin oxide (ITO)-coated glass substrates (Thin Film Devices, Inc.) were sonicated in acetone (30 min) and isopropanol (30 min) and oxygen plasma-cleaned (3 min) immediately prior to deposition of the PEDOT:PSS layer. PEDOT:PSS (2-5 wt % in water, Aldrich) was spin-coated in a nitrogen atmosphere at 4000 rpm and annealed at 150° C. (using a hotplate) for 15 min under nitrogen. A 40 nm PEDOT layer was thus obtained. Film thickness was determined by ellipsometry measurements on separate films prepared on silicon substrates. For the active layer, a 10 mg/mL solution of 1:1.2 P3HT:fullerene in 1,2-dichlorobenzene (DCB) was employed (in a representative example, 1.9 mg P3HT and 2.3 mg fullerene were dissolved in 0.2 mL DCB). 60 µL of this solution was then spin-coated onto the PEDOT layer at 1000 rpm under nitrogen. The substrate was taken from the spin chuck and immediately placed under an inverted Petri dish inside the glovebox for 10 minutes to encourage solvent annealing from the small amount of residual DCB on the substrate. Next, the solar cells were placed on a 150° C. hotplate and annealed for 20 min under nitrogen. A 70±5 nm active layer was thus obtained. Following this deposition procedure, the top electrode was deposited by thermal evaporation of a 25 nm thick film of Ca followed by 80 nm thick film of Al. The device area, as defined by the anode-cathode overlap, is 1.21 mm².

Current density-voltage (J-V) measurements were recorded by a Keithley 6487 picoammeter both in the dark and under illumination. The devices were illuminated through the glass substrate using an Oriel 91191 150 W full spectrum solar simulator. The illumination intensity was calibrated to 100 mW/cm2 using an NREL-certified silicon photodiode. Spectral mismatch was not corrected for in these measurements.

Example 6

Figure 5A:
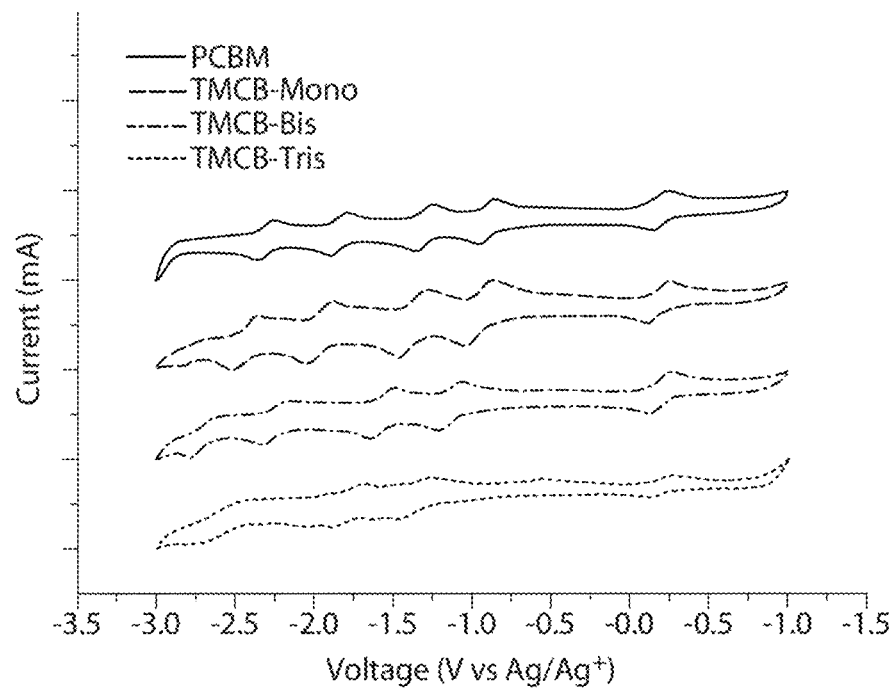
FIG. 5 shows cyclic voltammograms of (a) PCBM, mono-tetramethyl-cyclobutene-substituted fullerene ("TMCB-Mono"), bis-tetramethyl-cyclobutene-substituted fullerene ("TMCB-Bis"), and tris-tetramethyl-cyclobutene-substituted fullerene ("TMCB-Tris"), and of (b) PCBM, mono-tetrabutyl-cyclobutene-substituted fullerene ("TBCB-Mono"), and bis-tetrabutyl-cyclobutene-substituted fullerene ("TBCB-Bis").
Figure 5B:
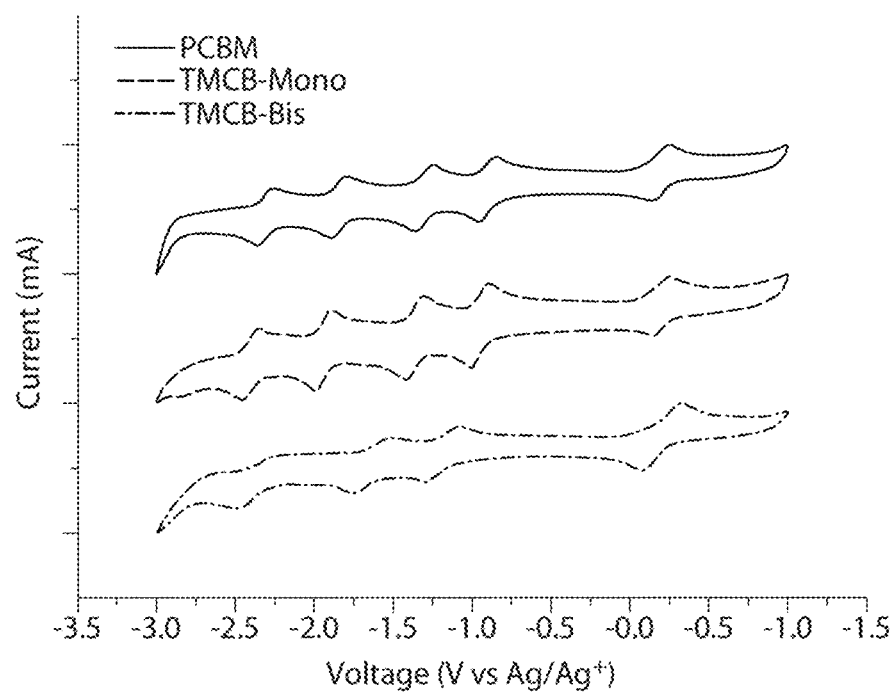

In the following example, the electrochemical properties of the substituted fullerenes described in the Examples were investigated. $C_{60}$ has triply-degenerate and low-lying LUMO energy levels and thereby can be reduced with up to six electrons. FIG. 5 shows cyclic voltammograms of PCBM and (a) TMCB Mono-, Bis-, and Trisadducts (b) TBCB Mono-, and Bisadducts (under $N_2$, 0.1M $Bu_4NPF_6$ in Toluene/Acetonitrile (4:1), Pt (WE), Pt wire (CE), Ag/AgNO₃ (RE), scan rate 0.1 V/s, Fc/Fc⁺ internal standard $E_{1/2}$ at 0.20 V). As shown in FIG. 5, three or four reversible redox waves were retained in the functionalized fullerenes under anhydrous air-free conditions, relative to the ferrocene/ferrocenium (Fc/Fc⁺) internal standard peaks at ca. 200 mV (±0.5 mV).

The monoadducts (TMCB-Mono and TBCB-Mono) exhibited four reversible redox peaks (FIGS. 5A-B), which are all shifted to negative potentials by ca. 100 mV as compared to PCBM, and the bisadducts showed an additional ca. 200 mV shift relative to the monoadducts. The measured half-wave potentials are listed in Table 1 together with the estimated LUMO energy levels relative to the vacuum level. The cyclic voltammogram of the trisadduct contained three major sets of the redox peaks, as well as another set of peaks, which may be attributed to a persistent tetrakisadduct impurity. (FIG. 5A) The three main redox potentials were further shifted by about 200 mV as compared to the bisadduct. The reversible sets of redox curves shown in FIG. 5A and FIG. 5B confirmed that the functionalization preserved the key electronic accepting characteristics of $C_{60}$. The pronounced negative shifts of redox curves and the corresponding increase of LUMO energy levels (90 meV for TMCB-Mono, 260 meV for TMCB-Bis, and 450 meV for TMCB-Tris) from PCBM were considerably greater than the indene-$C_{60}$ mono- and bisadduct (50 meV and 170 meV, respectively). This behavior was consistent with the theory the use of smaller angles between fused four-membered rings can effectively increase the π-orbital interaction between the pendant cyclobutene moiety and $C_{60}$ centered states.

The cyclic voltammograms of TMCB-adducts and TBCB-adducts are similar in terms of the shape and the positions of potentials, but the TBCB-adducts exhibited slightly more negative redox potentials. Considering the higher LUMOs of the TBCB-series a slightly higher $V_{OC}$ in photovoltaic devices may be expected, relative to those obtained for TMCB-adducts.

Example 7

In the following example, the photophysical properties of the substituted fullerenes described in the Examples were investigated.

Figure 6A:
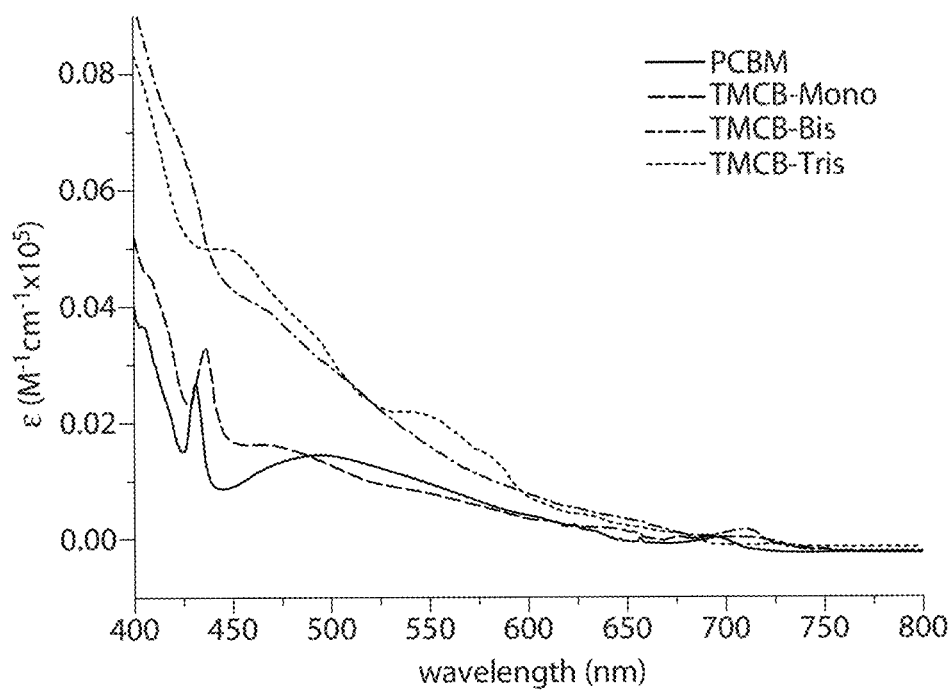
FIG. 6 shows absorption spectra, relative to PCBM, for (a) PCBM, TMCB-Mono, TMCB-Bis, and TMCB-Tris; and for (b) PCBM, TBCB-Mono, and TBCB-Bis, in $CHCl_3$.
Figure 6B:
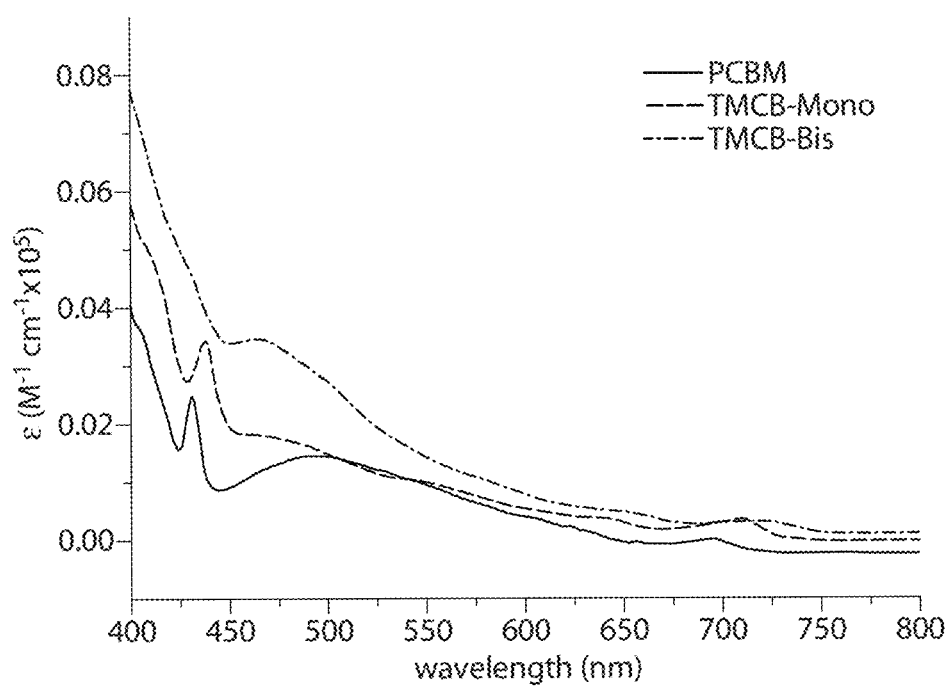
Figure 7:
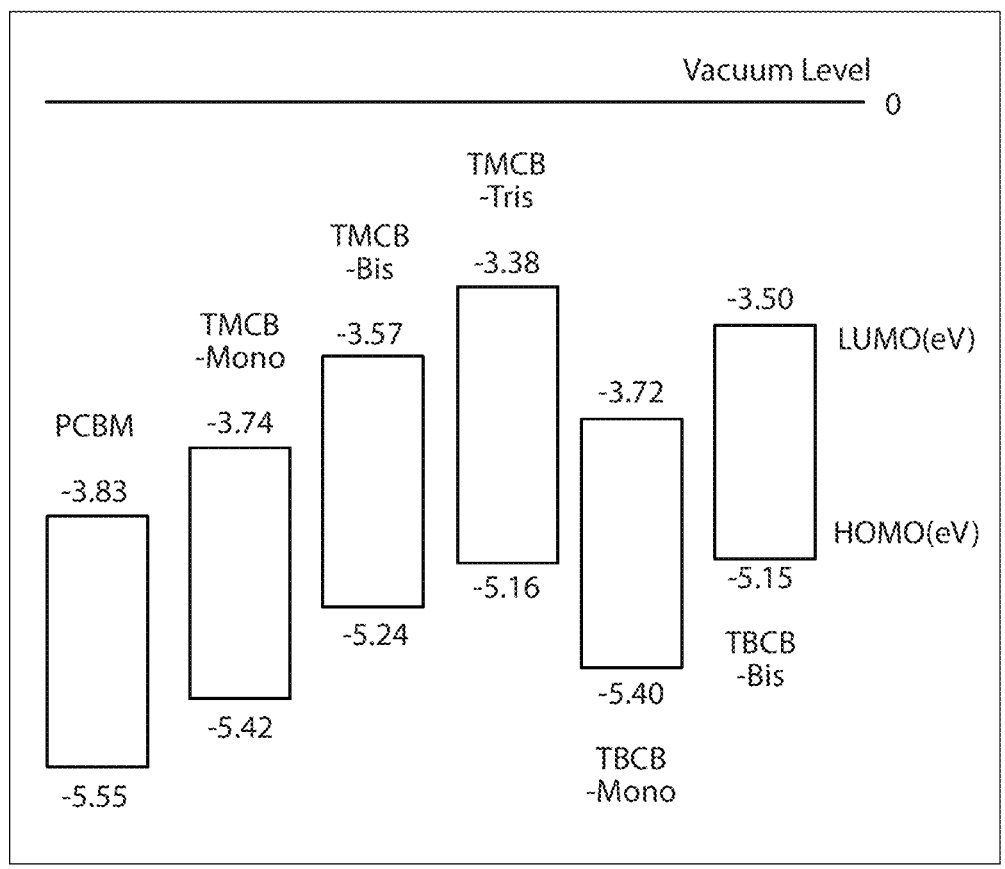
FIG. 7 shows a chart of the band gaps and HOMO/LUMO energy levels for various substituted fullerenes, relative to the vacuum level.

The visible and near-infrared spectral absorptions of BHJ devices can be a determinant of solar cell efficiencies. $J_{SC}$ is typically dependent on the number of charge carriers generated and their mobilities. Although $J_{SC}$ is generally dominated by the photon collection of the donor polymer, stronger visible light absorption of the acceptors can also contribute to light harvesting. Specifically, the weak optical absorptions of PCBM are considered a limitation and have led to interest in more costly $C_{70}$ acceptor materials. In FIG. 6, comparative absorption spectra (400 nm-800 nm) of the new fullerene derivatives are shown, relative to PCBM, for (a) PCBM (2.4×10−5 M) and TMCB-Mono (2.5×10−5 M), Bis (2.4×10−5 M), and Tris (2.0×10−5 M) and (b) TBCB-Mono (2.3×10−5 M), and Bis (1.3×10−5 M) in $CHCl_3$. The cyclobutene functionalized fullerenes exhibited the similar or higher absorptivity relative to PCBM. A more intense absorption was observed for the higher adducts, which is consistent with desymmetrization of fullerenes. The more allowed transitions obtained by reduced fullerene symmetry can therefore potentially create greater overall performance of organic photovoltaic devices. The sharper absorption peaks around 430 nm for TMCB- and TBCB-Mono compounds were slightly red-shifted from those of PCBM. Additionally, the bis- and trisadducts showed broader absorptions as a result of a mixture of regioisomers. Based upon their absorption properties new fullerene derivatives appear to offer advantages over PCBM in terms of the higher absorptivity and the red-shifted absorption edge around 700 nm. The wavelengths of absorption edge, $\lambda_{onset}$, vary from 697 nm to 751 nm, and longer wavelengths were observed for bisadducts than monoadducts and PCBM (Table 1). The trisadduct is a 56-π-electron fullerene and deviates from the trend with a small value of $\lambda_{onset}$. The band gaps and the HOMO energy levels of the fullerenes were calculated from $\lambda_{onset}$ and LUMO levels as summarized in FIG. 7 and Table 1. In FIG. 7, energy levels were drawn relative to the vacuum level that is by definition set to zero.

TABLE 1

HOMO and LUMO Energies Calculated from UV-Vis absorption and Cyclic Voltammetry.

| $C_{60}$ derivative | $E_1$ (V)[a] | $E_2$ (V) | $E_3$ (V) | $E_{onset}$ (V)[b] | LUMO (eV)[c] | $\lambda_{onset}$ (nm)[d] | HOMO (eV)[e] | $E_{gap}$ (eV)[f] |
|---|---|---|---|---|---|---|---|---|
| PCBM | −0.90 | −1.31 | −1.85 | −0.77 | −3.83 | 723 | −5.55 | 1.72 |
| TMCB-Mono | −0.96 | −1.38 | −1.97 | −0.86 | −3.74 | 738 | −5.42 | 1.68 |
| TMCB- | −1.14 | −1.57 | −2.25 | −1.03 | −3.57 | 746 | −5.24 | 1.67 |

TABLE 1-continued

HOMO and LUMO Energies Calculated from UV-Vis absorption and Cyclic Voltammetry.

| $C_{60}$ derivative | $E_1$ (V)[a] | $E_2$ (V) | $E_3$ (V) | $E_{onset}$ (V)[b] | LUMO (eV)[c] | $\lambda_{onset}$ (nm)[d] | HOMO (eV)[e] | $E_{gap}$ (eV)[f] |
|---|---|---|---|---|---|---|---|---|
| Bis TMCB-Tris | −1.37 | −1.79 | −2.57 | −1.22 | −3.38 | 697 | −5.16 | 1.78 |
| TBCB-Mono | −0.96 | −1.36 | −1.94 | −0.88 | −3.72 | 740 | −5.40 | 1.68 |
| TBCB-Bis | −1.19 | −1.64 | −2.38 | −1.10 | −3.50 | 751 | −5.15 | 1.65 |

[a]Half-wave potential, 0.5 (Ep. a. + Ep. c.); Ep. a., anodic peak potential; Ep. c. cathodic peak potential;
[b]Onset reduction potential;
[c]LUMO (eV) = −e (Eonset + 4.60);
[d]Onset absorption wavelength;
[e]HOMO = LUMO − Egap [eV];
[f]Band gap = hc/λonset, converted [J] to [eV]; h, Planks constant; c, speed of light.

Example 7

Figure 8A:
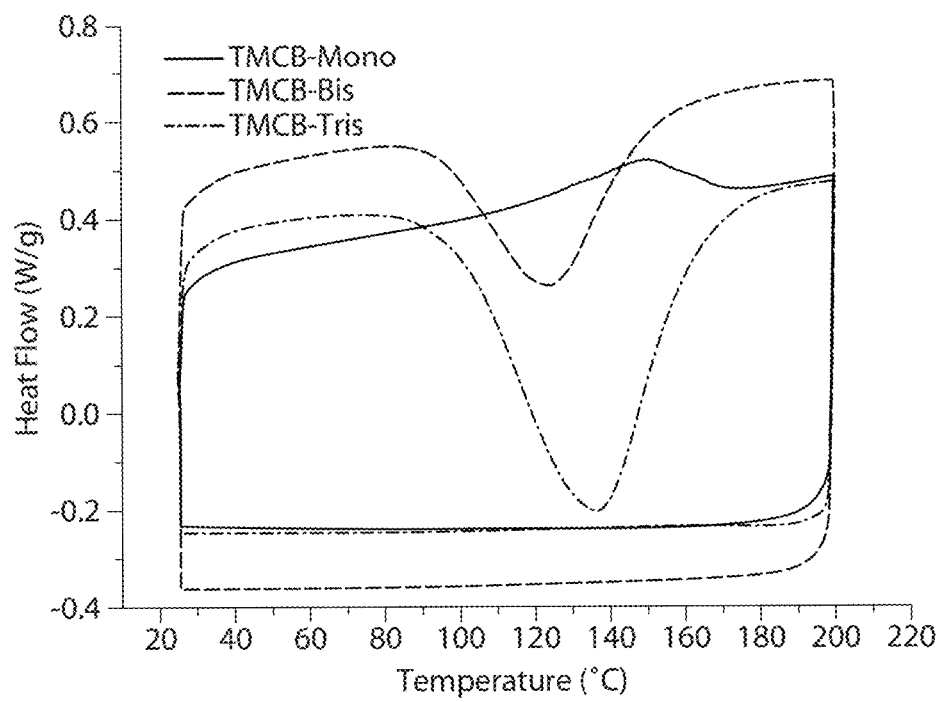
FIG. 8 shows differential scanning calorimetry (DSC) data for (a) the first DSC cycles for TMCB-Mono, TMCB-Bis, and TMCB-Tris; (b) the second DSC cycles for TMCB-Mono, TMCB-Bis, and TMCB-Tris; (c) the first DSC cycles for TBCB-Mono and TBCB-Bis; and (d) the second DSC cycles for TBCB-Mono and TBCB-Bis.
Figure 8B:
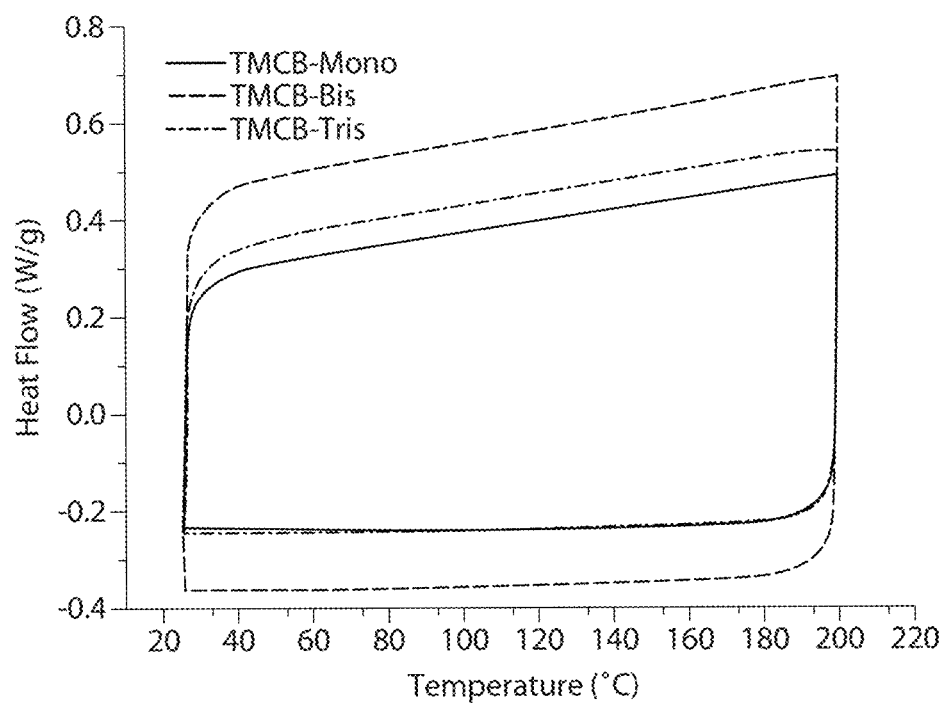
Figure 8C:
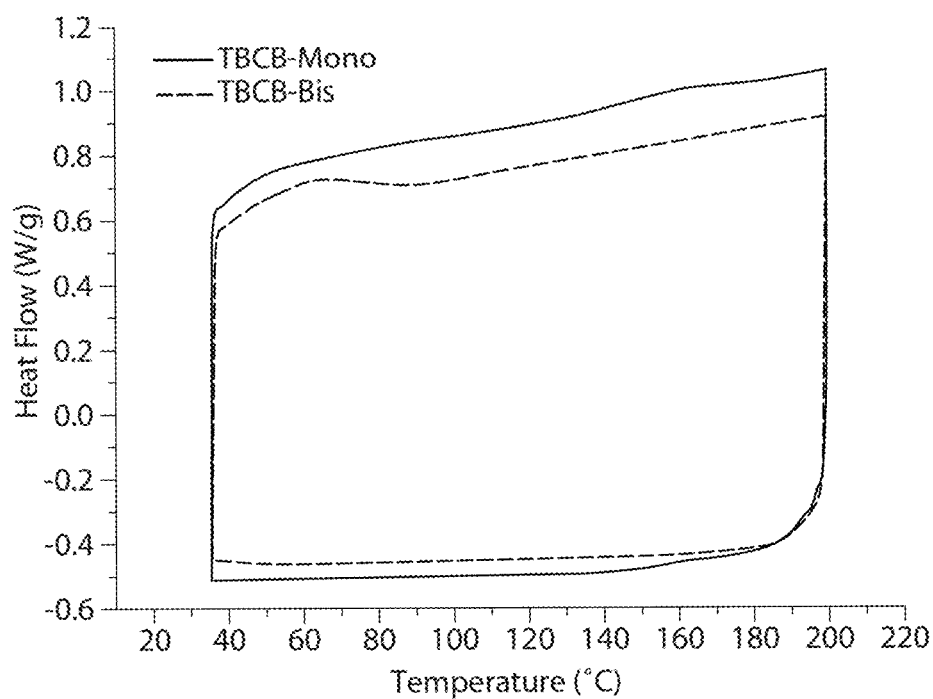
Figure 8D:
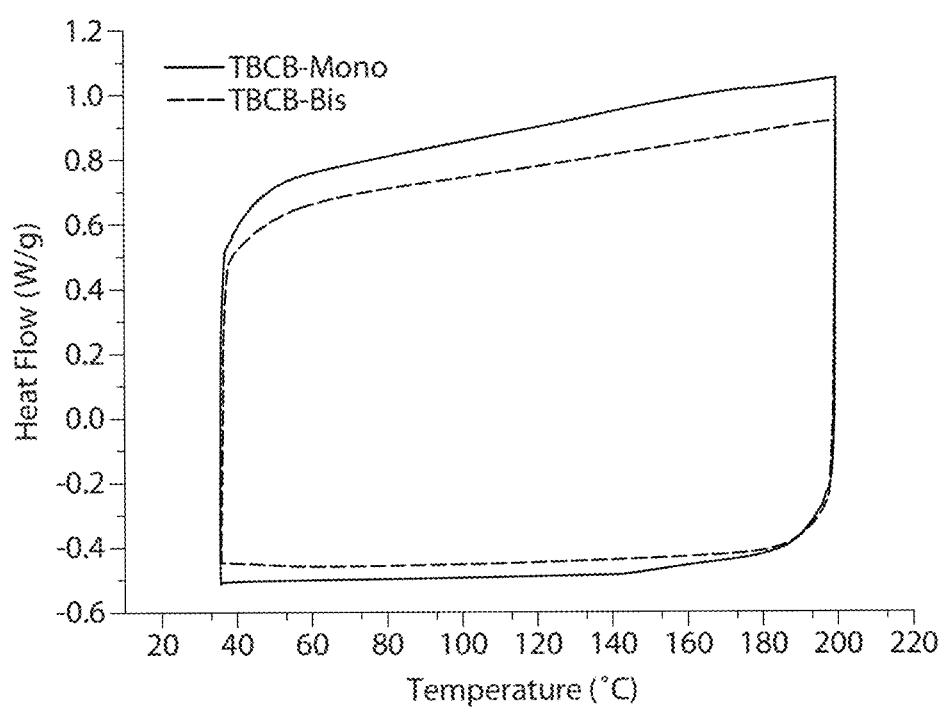
Figure 9A:
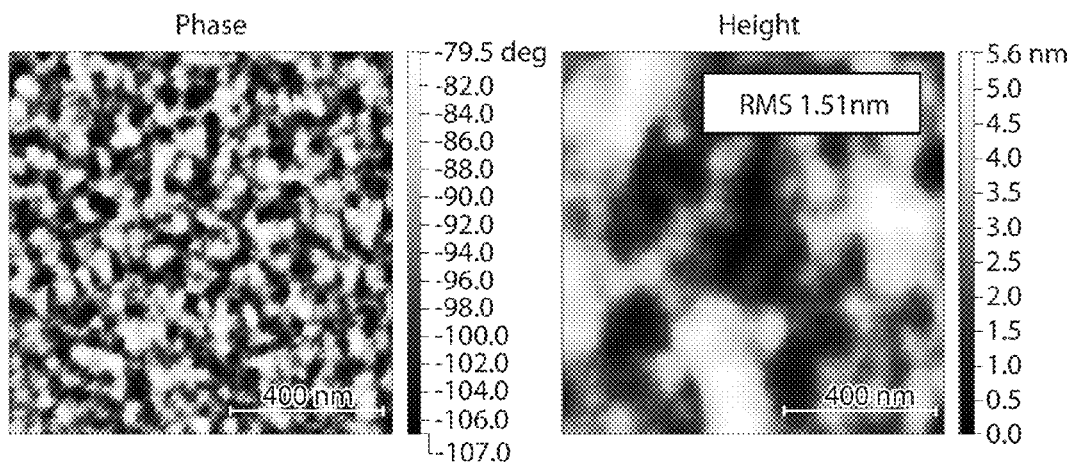
FIG. 9 shows tapping-mode atomic force microscopy (1 μm window) phase and topography images of the films prepared from (a) PCBM, (b) TMCB-Mono, (c) TMCB-Bis, and (d) TMCB-Tris.
Figure 9B:
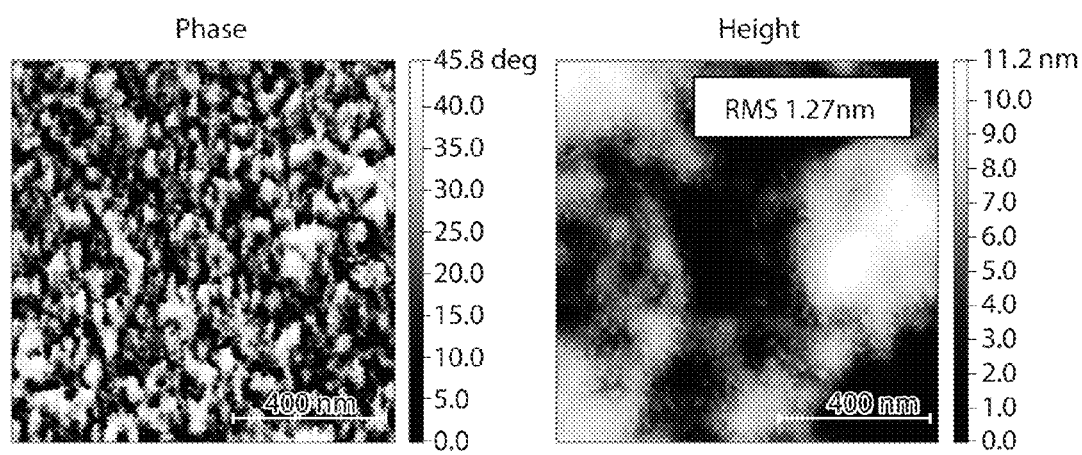
Figure 9C:
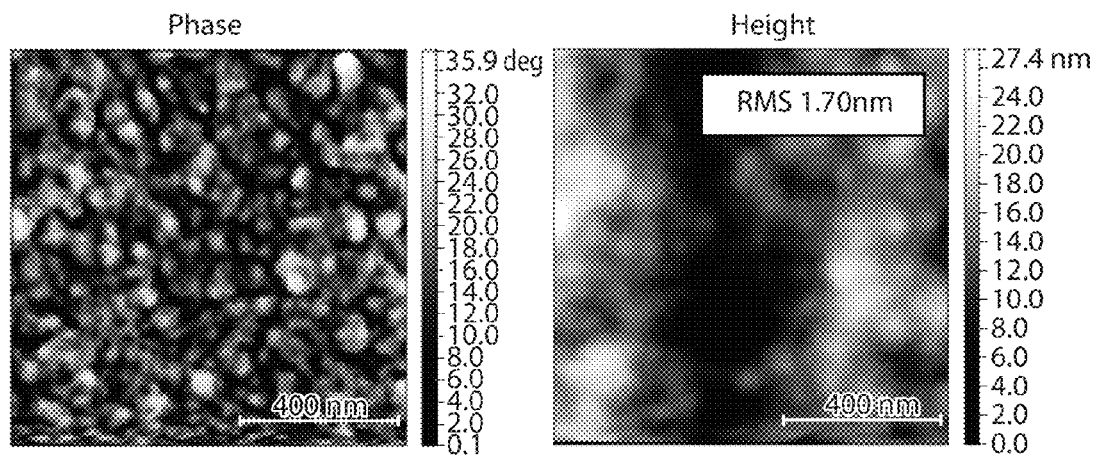
Figure 9D:
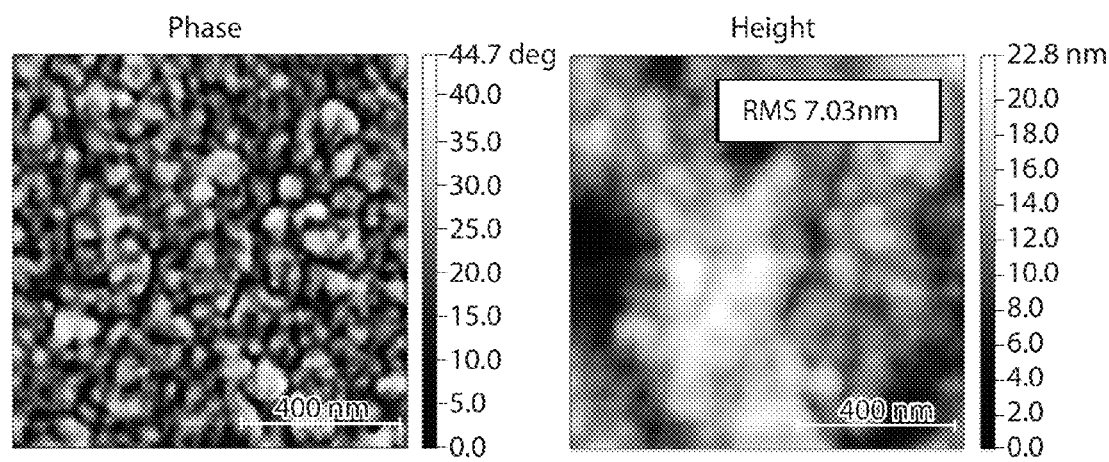

In the following example, the thermal properties of the substituted fullerenes described in the Examples were investigated. The thermal stability of the molecules was determined by thermogravimetric analysis (TGA), which showed minor weight loss of less than 5% at 200° C. All functionalized fullerenes were less stable than pristine $C_{60}$, which has outstanding thermal stability up to 500-600° C. $C_{60}$ derivatives often display a change in morphology or decomposition at around 150° C., and the typical annealing temperatures used in polymer solar cell fabrications affect their performance. To further investigate the thermal properties of the fullerene adducts and the effects of annealing, differential scanning calorimetry (DSC) experiments were conducted over the range from 25° C. to 200° C. (FIG. 8) In the first cycle, a strong and broad exothermic heat flow was observed for TMCB-Bis and Tris from 90° C. to 150° C. and 80° C. to 190° C., respectively. (FIG. 8A) In contrast, the TMCB-Mono displayed a small endothermic peak which starts to appear at ca. 110° C., the boiling point of toluene. The second DSC cycles were featureless for all of the compounds. (FIG. 8B) The mono- and bisadduct of tetrabutylcyclobutene exhibited relatively plain heat flow to their tetramethyl counterparts. (FIGS. 8C-D)

BHJs formed with P3HT after annealing at 150° C. for 20 min were then studied by atomic force microscopy (AFM). FIG. 9 shows tapping-mode atomic force microscopy (1 μm window) phase and topography images of the films prepared from (a) PCBM, (b) TMCB-Mono, (c) TMCB-Bis, and (d) TMCB-Tris. P3HT was used as a donor for all devices. PEDOT:PSS was used as the under-layer. All BHJs were annealed at 150° C. for 20 min. Root-mean-square roughness was measured and indicated in the topography images. The larger grain sizes (root-mean-square roughness) and more pronounced phase separation were observed in the films with higher adducts. The P3HT/TMCB-Mono morphology most closely resembled the roughness of the P3HT/PCBM blend.

To determine if any of the features observed for the higher adducts in the DSC and AFM reflected thermal decomposition or only morphology changes, the $^1$H NMR spectra of the fullerene derivatives was measured after three DSC cycles. The TMCB-Bis gained the peaks of TMCB-Mono, and TMCB-Tris gained the peaks of TMCB-Mono and TMCB-Bis. Without wishing to be bound by theory, it is possible that larger phase separation of the BHJ layers with the multiadducts stemmed from the decomposition of the fullerene multiadducts into less-functionalized adducts upon annealing. The $^1$H NMR spectra of the TMCB-Mono, TBCB-Mono, and TBCB-Bis after three DSC cycles did not display any detectable changes thereby confirming superior thermal stability as compared to the TMCB multiadducts.

To determine if crystallization might also be responsible for the exothermic DSC transitions of the TMCB multiadducts at high temperatures, X-ray diffraction experiments were conducted. TMCB and TBCB monoadducts were observed to be a single regioisomer, presumably fused to $C_{60}$ in [6,6]-closed fashion as usual Diels-Alder cycloaddition products of $C_{60}$, and exhibited microcrystallinity. The butyl groups on cyclobutene-$C_{60}$ produce a larger lattice spacing (11.2 Å) than methyl groups (10.1 Å). For multiadducts, the mixture of isomers reduced crystallinity of the sample, and TMCB-Bis remained in an amorphous state even after three DSC cycles. Without wishing to be bound by theory, the observed DSC exothermic transitions for the multiadducts could be attributed to the result of retro-cycloaddition reactions.

Example 8

Figure 10:
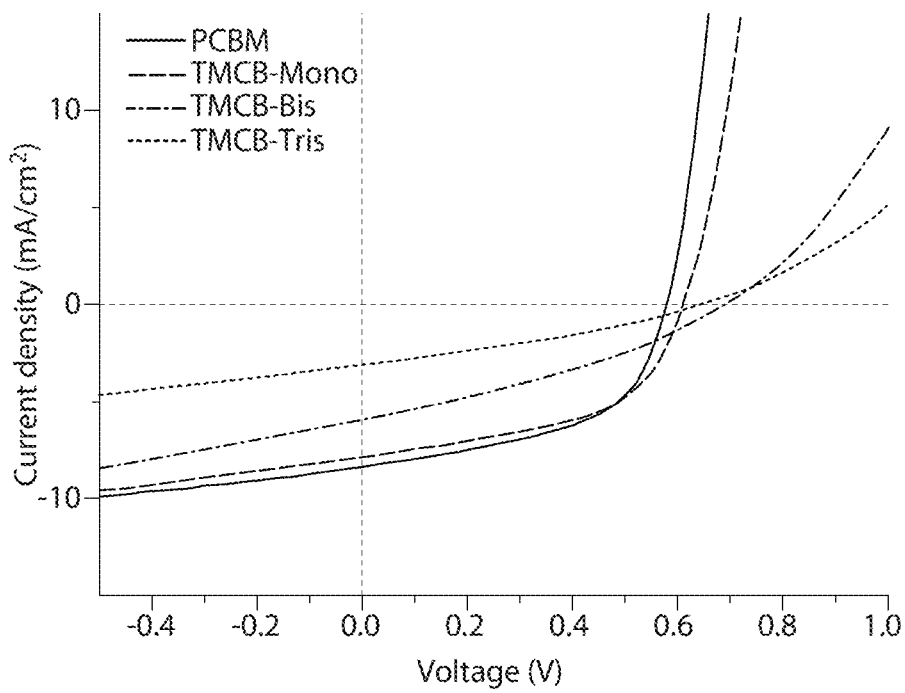
FIG. 10 shows current density-voltage (J-V) characteristics of bulk heterojunction PSCs under AM 1.5 illumination at 100 mW/$cm^2$ for PCBM, TMCB-Mono, TMCB-Bis, and TMCB-Tris.

The following example describes the organic photovoltaic performance of substituted fullerenes described in the Examples. FIG. 10 shows current density-voltage (J-V) characteristics of bulk heterojunction PSCs under AM 1.5 illumination at 100 mW/cm$^2$ for PCBM, TMCB-Mono, TMCB-Bis, and TMCB-Tris. ITO (150 nm)/PEDOT:PSS (40 nm)/P3HT:Fullerenes (75 nm)/Ca (25 nm)/Al (80 nm) were used for device fabrication. Specifically TMCB-Mono, Bis, and Tris are compared to the well-known P3HT/PCBM system. As predicted based on the LUMO energy levels, TMCB-Mono gave a higher open-circuit voltage than PCBM. The P3HT/TMCB-Mono system also displayed a short-circuit current density, fill factor, and PCE (η) comparable to the P3HT/PCBM device. The J-V curve of TMCB-Bis displayed a higher $V_{OC}$, consistent with its higher LUMO level, but a much lower $J_{SC}$ and decreased fill factor lead to poor efficiency. The thermal instabilities of the higher fullerene cyclobutene adducts may contribute to lower efficiencies. The performance of the P3HT/TMCB-Tris cell displayed even lower $J_{SC}$. An interesting feature was that the open-circuit voltage of TMCB-Tris was smaller than that of TMCB-Bis. This discrepancy might result from the excessive decomposition of Tris upon annealing. Correspondingly, the calculated PCE (Table 2) of P3HT/TMCB-Mono (2.49%), comparable with that of P3HT/PCBM (2.57%), and the smaller values for P3HT/TMCB-Bis (1.35%) and P3HT/TMCB-Tris (0.65%) were consistent with the degree of phase separation and root-mean-square roughness discovered on AFM images.

In order to obtain the optimized performance of fullerene adducts with longer alkyl chains, the devices were annealed with TBCB-Mono and TBCB-Bis at 90° C. P3HT/TBCB-Mono blend produced higher $V_{OC}$ (0.64 V) and $J_{SC}$ (9.72 mA/cm$^2$) compared to P3HT/PCBM, but the increased resistance in the blend resulted in lower fill factor and comparable PCE (2.43%). The decreased $V_{OC}$ (0.61 V) and $J_{SC}$ (1.37 mA/cm$^2$) of P3HT/TBCB-Bis cell led to poor PCE (0.23%), suggesting that less desirable performances were obtained from our multiadducts. In addition, the comparison of the J-V curves from different annealing conditions (90° C. and 120° C.) reflected the negative effect of thermal annealing at high temperatures on the cells.

TABLE 2

Characteristics of OPV Devices [a]

|  | TMCB-Mono | Bis | Tris | PCBM |
|---|---|---|---|---|
| $J_{SC}$ (mA/cm$^2$) | 7.86 | 5.92 | 3.13 | 8.35 |
| $V_{OC}$ (V) | 0.61 | 0.69 | 0.65 | 0.58 |
| FF (%) | 0.52 | 0.33 | 0.32 | 0.53 |
| η (%) | 2.49 | 1.35 | 0.65 | 2.57 |

[a] Definitions: short-circuit current density, $J_{SC}$; open-circuit voltage, $V_{OC}$; fill factor, FF; PCE, η.

Example 9

Figure 4:
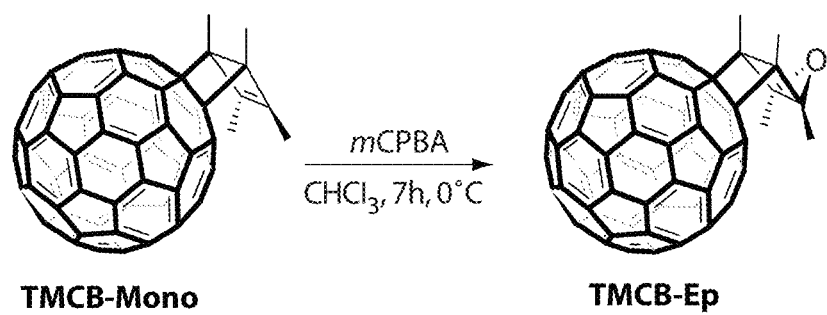
FIG. 4 shows the epoxidation of a mono-tetramethylcyclobutene-substituted fullerene.

The following example describes the investigation of cyclobutene-substituted fullerenes, and interaction between the pi-bond of the cyclobutene substituent with the fullerene. To chemically probe the hypothesis that large decrease in electron affinity in the cyclobutene fullerenes is the result of strong interactions between the cyclobutene double bond and the $C_{60}$ π-system, a simple experiment was performed to remove the double bond via epoxidation with 3-chloroperbenzoic acid (mCPBA). (FIG. 4) The reaction proceeded with 96% yield, and the product had significantly different polarity from the starting material, which facilitated purification. The identity of the product was supported by $^1$H and $^{13}$C NMR spectra as well as HRMS. Epoxidation of TBCB-Mono was unsuccessful presumably as a result of steric hindrance around the reaction site, and only starting material was recovered.

Figure 11:
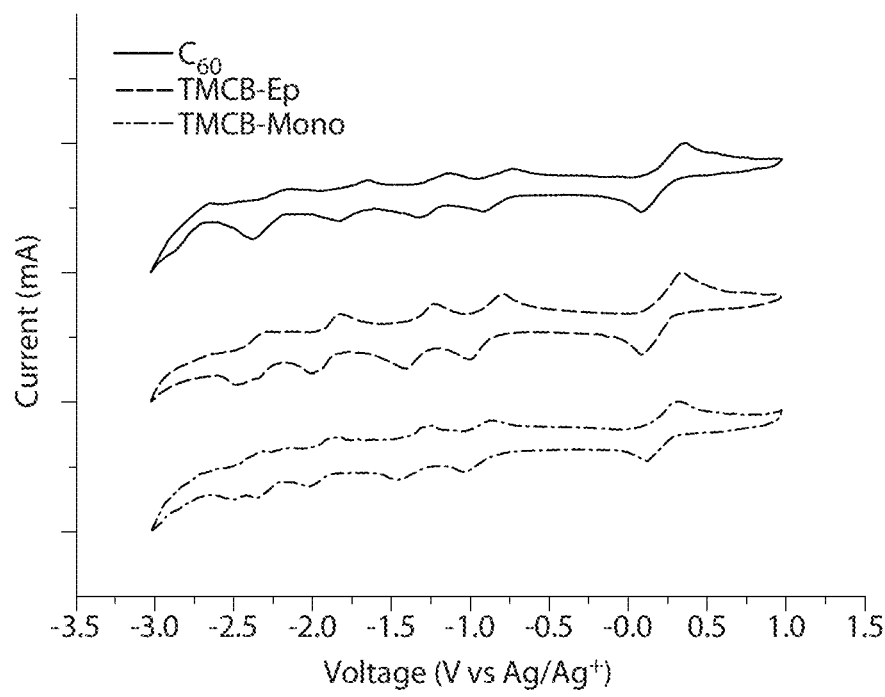
FIG. 11 shows cyclic voltammograms for $C_{60}$, TMCB-Mono, and the epoxidation product of TMCB-Mono ("TMCB-Ep").

Cyclic voltammetry of TMCB-Ep exhibited four reversible redox peaks like other monoadducts, but half-wave potentials were located approximately half way between those of pristine $C_{60}$ and the TMCB-Mono compound. (FIG. 11) In Table 3, the half-wave potentials of TMCB-Ep are summarized. The difference between LUMO energy levels of $C_{60}$ and TMCB-Ep is 60 meV, and the gap between those of TMCB-Ep and TMCB-Mono was 50 meV. From this observation, it can be concluded that orbital interactions between the cofacial cyclobutene and $C_{60}$ π-systems contribute to the observed LUMO raising. The electron affinity of TMCB-Ep was still lower than that of $C_{60}$ and this may be the result of the σ-π hyperconjugative interactions.

To further support this assertion, quantum-chemical density functional theory (DFT) calculations (B3LYP functional/6-31G (d,p) basis set) of TMCB-Mono and TMCB-Ep were conducted. The geometry optimized structures had HOMO and LUMO energy levels of −5.57 eV and −3.04 eV for TMCB-Mono, and −5.69 eV and −3.16 eV for TMCB-Ep. These results also indicated that epoxidation of the cyclobutene moiety decreased the LUMO level. The calculated distances between $C_{60}$ cage and the attached functional groups were 3.05 Å and 3.10 Å for TMCB-Mono and TMCB-Ep, sufficiently short to allow for cofacial π-orbital interactions. It was apparent in the LUMO representations of TMCB-Mono that the wavefunction on the double bond of the cyclobutene moiety and that on the adjacent $C_{60}$ π-orbital possessed the opposite signs. Without wishing to be bound by any theory, the LUMO level of $C_{60}$ may be raised effectively due to this close π-π interaction between the two moieties. On the other hand, for TMCB-Ep, the hyperconjugative interaction between the C—H σ-bonds of methyl groups and $C_{60}$ π-system is outstanding for most of the MOs rather than cofacial π interaction.

In conclusion, two families of tetraalkylcyclobutene-$C_{60}$ adducts were generated via Diels-Alder cycloaddition reactions between in situ generated cyclobutadiene intermediates and $C_{60}$. The mono-, bis-, and tris-adduct with tetraalkylcyclobutene groups were formed, and their electrochemical, photophysical, and thermal properties were compared. The thermal annealing process in device fabrication was revealed to be destructive for the new fullerene bis- and trisadducts, leading to large phase separation and low PCEs. The structural advantage of cyclobutene adducts was proved via epoxidation of cyclobutene, which confirmed that strong cofacial π-orbital interactions between $C_{60}$ π-system and the double bond π-orbital contribute to raising the LUMO levels. Based on these results, n-type materials for bulk heterojunction polymer solar cells can be chemically modified to fine-tune their electronic properties and thus the resulting open-circuit voltages in organic solar cells.

Having thus described several aspects of some embodiments of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:

1. A device, comprising:
   a composition comprising a carbon nanostructure comprising at least one cyclobutyl and/or at least one cyclobutenyl group, any of which is optionally substituted; and
   at least one electrode in electrochemical communication with the composition,
   wherein the composition exhibits an increase in LUMO energy level of about 50 meV relative to the LUMO energy level of ([6,6]-phenyl-C61-butyric acid methyl ester) (PCBM).

2. A device as in claim 1, wherein the carbon nanostructure comprises a fused network of aromatic rings, optionally comprising a border at which the fused network terminates, wherein the at least one cyclobutyl and/or at least one cyclobutenyl group is attached to the network via at least one ring atom of the network.

3. A device as in claim 2, wherein two ring atoms of the at least one cyclobutyl and/or at least one cyclobutenyl group form covalent bonds with two ring atoms of the network of aromatic rings.

4. A device as in claim 1, wherein the carbon nanostructure comprises two cyclobutenyl groups, optionally substituted.

5. A device as in claim 1, wherein the carbon nanostructure comprises three cyclobutenyl groups, optionally substituted.

6. A device as in claim 1, wherein the carbon nanostructure is a fullerene, a nanotube, graphene, or graphite.

7. A device as in claim 1, wherein the carbon nanostructure comprises the following structure,

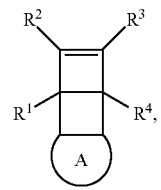

wherein:
A is a carbon nanostructure; and
R¹-R⁴ can be the same or different and hydrogen, hydroxyl, halo, alkyl, heteroalkyl, alkenyl, heteroalkenyl, aryl, heteroaryl, or heterocycle, any of which is optionally substituted.

8. A device as in claim 7, wherein R¹-R⁴ are alkyl.

9. A device as in claim 1, wherein the carbon nanostructure comprises the following structure,

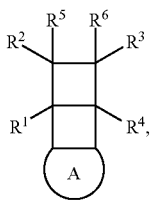

wherein:
A is a carbon nanostructure; and
R¹-R⁶ can be the same or different and are hydrogen, hydroxyl, halo, alkyl, heteroalkyl, alkenyl, heteroalkenyl, aryl, heteroaryl, or heterocycle, any of which is optionally substituted, or any two of R¹-R⁶ are joined to form an optionally substituted ring.

10. A device as in claim 9, wherein R⁵ and R⁶ are joined to form an epoxide ring.

11. A device as in claim 9, wherein at least one of R¹-R⁴ is not hydrogen.

12. A device as in claim 9, wherein at least one of R¹-R⁶ is not hydrogen.

13. A device as in claim 1, wherein the device is a battery, capacitor, transistor, catalyst system, solar cell, or chemical or biological sensor.

14. A photovoltaic device, comprising:
a photoactive material comprising an electron donor material and an electron acceptor material comprising a carbon nanostructure and a cyclobutyl-containing group and/or a cyclobutenyl-containing group in contact with the electron donor material; and
at least two electrodes in electrical communication with the photoactive material,
the electron acceptor material exhibits an increase in LUMO energy level of about 50 meV relative to the LUMO energy level of ([6,6]-phenyl-C61-butyric acid methyl ester) (PCBM).

15. A photovoltaic device as in claim 14, wherein electron acceptor material comprises a carbon nanostructure comprising the cyclobutyl-containing group and/or a cyclobutenyl-containing group, and wherein the carbon nanostructure comprises a fused network of aromatic rings, optionally comprising a border at which the fused network terminates, wherein the cyclobutyl and/or cyclobutenyl group is attached to the network via at least one ring atom of the network.

16. A photovoltaic device as in claim 15, wherein the carbon nanostructure is a fullerene, a nanotube, graphene, or graphite.

17. A photovoltaic device as in claim 15, wherein the carbon nano structure comprises the following structure,

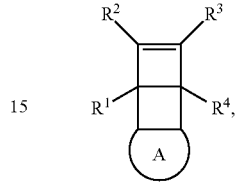

wherein:
A is a carbon nanostructure; and
R¹-R⁴ can be the same or different and hydrogen, hydroxyl, halo, alkyl, heteroalkyl, alkenyl, heteroalkenyl, aryl, heteroaryl, or heterocycle, any of which is optionally substituted.

18. A photovoltaic device as in claim 17, wherein R¹-R⁴ are alkyl.

19. A photovoltaic device as in claim 15, wherein the carbon nano structure comprises the following structure,

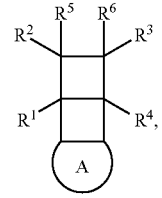

wherein:
A is a carbon nanostructure; and
R¹-R⁶ can be the same or different and are hydrogen, hydroxyl, halo, alkyl, heteroalkyl, alkenyl, heteroalkenyl, aryl, heteroaryl, or heterocycle, any of which is optionally substituted, or any two of R¹-R⁶ are joined to form an optionally substituted ring.

20. A photovoltaic device as in claim 19, wherein R⁵ and R⁶ are joined to form an epoxide ring.

21. A photovoltaic device as in claim 14, wherein the electron donor material comprises a conducting polymer.

22. A photovoltaic device as in claim 14, wherein the photovoltaic device is a solar cell.

* * * * *